(12) United States Patent
Schouhamer Immink

(10) Patent No.: US 7,295,138 B2
(45) Date of Patent: Nov. 13, 2007

(54) METHOD AND APPARATUS FOR CODING INFORMATION, METHOD AND APPARATUS FOR DECODING CODED INFORMATION, METHOD OF FABRICATING A RECORDING MEDIUM, THE RECORDING MEDIUM AND MODULATED SIGNAL

(75) Inventor: Kees A. Schouhamer Immink, Geldrop (NL)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/404,906

(22) Filed: Apr. 17, 2006

(65) Prior Publication Data

US 2006/0187095 A1 Aug. 24, 2006

Related U.S. Application Data

(63) Continuation of application No. 10/902,920, filed on Aug. 2, 2004, now Pat. No. 7,030,784, which is a continuation of application No. 09/707,947, filed on Nov. 8, 2000, now Pat. No. 6,967,597.

(30) Foreign Application Priority Data

Nov. 11, 1999 (EP) .................................. 99203739

(51) Int. Cl.
*H03M 5/00* (2006.01)
(52) U.S. Cl. .......................................... 341/58; 341/59
(58) Field of Classification Search .................. 341/58, 341/65, 50, 106, 59
See application file for complete search history.

(56) References Cited

U.S. PATENT DOCUMENTS 4,413,251 A 11/1983 Adler et al.
(Continued)

FOREIGN PATENT DOCUMENTS

CN 1166225 A 11/1997

(Continued)

OTHER PUBLICATIONS

Codes for Mass Data Storage Systems, Kees A. Schouhamer Immink, Institute for Experimental Mathematics, University of Essen, Essen Germany. Published by Shannon Foundation Publishers, The Netherlands, 1999, no month.

(Continued)

*Primary Examiner*—Brian Young
(74) *Attorney, Agent, or Firm*—Birch, Stewart, Kolasch & Birch, LLP

(57) ABSTRACT

In the coding device and method, m-bit information words are converted into n-bit code words such that the coding rate m/n is greater than ⅔. The n-bit code words are divided into a first type and a second type, and into coding states of a first kind and a second kind such that an m-bit information word is converted into an n-bit code word of the first or second kind if the previous m-bit information word was converted into an n-bit code word of the first type and is converted into an n-bit code word of the first kind if the previous m-bit information word was converted into an n-bit code word of the second type. In one embodiment, n-bit code words of the first type end in zero, n-bit code words of the second type end in one, n-bit code words of the first kind start with zero, and n-bit code words of the second kind start with zero or one. Furthermore, in the embodiments, the n-bit code words satisfy a dk-constraint of (1,k) such that a minimum of 1 zero and a maximum of k zeros falls between consecutive ones. The coding device and method are employed to record information on a recording medium and thus create the recording medium. The coding device and method are further employed to transmit information. In the decoding method and apparatus, n-bit code words are decoded into m-bit information words. The decoding involves determining the state of a next n-bit code word, and based on the state determination, the current n-bit code word is converted into an m-bit information word. The decoding device and method are employed to reproduce information from a recording medium, and to receive information transmitted over a medium.

29 Claims, 24 Drawing Sheets

U.S. PATENT DOCUMENTS

| | | | |
|---|---|---|---|
| 4,488,142 A | | 12/1984 | Franaszek |
| 4,760,378 A | | 7/1988 | Iketani et al. |
| 5,047,767 A | | 9/1991 | Weathers et al. |
| 5,642,113 A | * | 6/1997 | Schouhamer Immink .... 341/58 |
| 5,790,056 A | * | 8/1998 | Schouhamer Immink .... 341/58 |
| 5,859,601 A | * | 1/1999 | Moon et al. .................. 341/59 |
| 5,920,272 A | | 7/1999 | Schouhamer Immink |
| 5,923,629 A | | 7/1999 | Noxon et al. |
| 6,018,304 A | | 1/2000 | Bessios |
| 6,034,150 A | | 3/2000 | Hoyle et al. |
| 6,195,025 B1 | | 2/2001 | Hassner et al. |

FOREIGN PATENT DOCUMENTS

| | | |
|---|---|---|
| JP | 2000-502545 A | 2/2000 |
| JP | 2001-195833 A | 7/2001 |
| JP | 2003-528417 A | 9/2003 |
| WO | PCT 00/21198 A1 | 4/2000 |
| WO | WO-00/20517 A2 | 4/2000 |

OTHER PUBLICATIONS

European Search Report dated Sep. 23, 2005.

Kees A. Schouhamer Immink, A Rate ⅙ (d=1, k=11) Block-Decodable, Runlength-Limited Code, IEEE Transactions On Information Theory, vol. 42, No. 5, Sep. 1996, pp. 1551-1553.

* cited by examiner

| k | C(1,k) |
|---|---|
| 7 | 0.67929 |
| 8 | 0.68525 |
| 9 | 0.68879 |
| INF. | 0.69424 |

|  | 1st KIND | | | 2nd KIND | |
|---|---|---|---|---|---|
| SUBGROUP | STATE 1 | STATE 2 | STATE 3 | STATE 4 | STATE 5 |
| E00 | 76 | 76 | 76 | 1 | 1 |
| E01 | 44 | 44 | 44 | 5 | 6 |
| E10 | 0 | 0 | 0 | 72 | 71 |
| E11 | 0 | 0 | 0 | 44 | 45 |

FIG. 4A

| Data bits | State 1 Channel bits | state | State 2 Channel bits | state | State 3 Channel bits | state | State 4 Channel bits | state | State 5 Channel bits | state |
|---|---|---|---|---|---|---|---|---|---|---|
| 0 000000000 | 0000000000100 | 1 | 0001010001010 | 1 | 0101000000100 | 1 | 0101000000000 | 1 | 1010101010101 | 3 |
| 1 000000001 | 0000000000100 | 2 | 0001010001010 | 2 | 0101000000100 | 2 | 0101000000000 | 2 | 0010000000000 | 2 |
| 2 000000010 | 0000000000100 | 3 | 0001010001010 | 3 | 0101000000100 | 3 | 0101000000000 | 3 | 0010000000000 | 3 |
| 3 000000011 | 0000000000100 | 4 | 0001010001010 | 4 | 0101000000100 | 4 | 0101000000000 | 4 | 0010000000000 | 4 |
| 4 000000100 | 0000000000100 | 5 | 0001010001010 | 5 | 0101000000100 | 5 | 0101000000000 | 5 | 0010000000000 | 5 |
| 5 000000101 | 0000000001000 | 1 | 0001010010010 | 1 | 0100000100100 | 1 | 0101001001001 | 1 | 0101010001001 | 1 |
| 6 000000110 | 0000000001000 | 2 | 0001010010010 | 2 | 0100000100100 | 2 | 0101001001001 | 2 | 0101010001001 | 2 |
| 7 000000111 | 0000000001000 | 3 | 0001010010010 | 3 | 0100000100100 | 3 | 0101001001001 | 3 | 0101010001001 | 3 |
| 8 000001000 | 0000000001000 | 4 | 0001010010010 | 4 | 0100000100100 | 4 | 0101010010001 | 1 | 0101010001001 | 1 |
| 9 000001001 | 0000000001000 | 5 | 0001010010010 | 5 | 0100000100100 | 5 | 0101010010001 | 2 | 0101010010001 | 2 |
| 10 000001010 | 0000000001010 | 1 | 0001010100010 | 1 | 0010100000100 | 1 | 0101001010001 | 3 | 0101010010001 | 3 |
| 11 000001011 | 0000000001010 | 2 | 0001010100010 | 2 | 0010100000100 | 2 | 0101001010101 | 1 | 0101010010101 | 1 |
| 12 000001100 | 0000000001010 | 3 | 0001010100010 | 3 | 0010100000100 | 3 | 0101001010101 | 2 | 0101010010101 | 2 |
| 13 000001101 | 0000000001010 | 4 | 0001010100010 | 4 | 0010100000100 | 4 | 0101001010101 | 3 | 0101010010101 | 3 |
| 14 000001110 | 0000000001010 | 5 | 0001010100010 | 5 | 0101010000001 | 1 | 0101010100001 | 1 | 0101010100001 | 1 |
| 15 000001111 | 0000000010000 | 1 | 0001010101010 | 1 | 0101000010100 | 1 | 0101010000001 | 2 | 0101010100001 | 2 |
| 16 000010000 | 0000000010000 | 2 | 0001010101010 | 2 | 0101000010100 | 2 | 0101010000001 | 3 | 0101010100001 | 3 |
| 17 000010001 | 0000000010000 | 3 | 0001010101010 | 3 | 0101000010100 | 3 | 0101010000101 | 1 | 0101010100101 | 1 |
| 18 000010010 | 0000000010000 | 4 | 0001010101010 | 4 | 0101000010100 | 4 | 0101010000101 | 2 | 0101010100101 | 2 |
| 19 000010011 | 0000000010000 | 5 | 0001010101010 | 5 | 0101000010100 | 5 | 0101010000101 | 3 | 0101010100101 | 3 |
| 20 000010100 | 0000000010010 | 1 | 0010000000010 | 1 | 0010000010100 | 1 | 1000000000010 | 1 | 0101010101001 | 1 |
| 21 000010101 | 0000000010010 | 2 | 0010000000010 | 2 | 0010000010100 | 2 | 1000000000010 | 2 | 0101010101001 | 2 |
| 22 000010110 | 0000000010010 | 3 | 0010000000010 | 3 | 1000000010100 | 3 | 1000000000010 | 3 | 0101010101001 | 3 |
| 23 000010111 | 0000000010010 | 4 | 0010000000010 | 4 | 0010000010100 | 4 | 1000000000010 | 4 | 1010010010100 | 1 |
| 24 000011000 | 0000000010010 | 5 | 0010000000010 | 5 | 0010000010100 | 5 | 1000000000010 | 5 | 1010010010100 | 2 |
| 25 000011001 | 0000000010100 | 1 | 0010000001010 | 1 | 0101000100100 | 1 | 1000000001010 | 1 | 1010010010100 | 3 |
| 26 000011010 | 0000000010100 | 2 | 0010000001010 | 2 | 0101000100100 | 2 | 1000000001010 | 2 | 1010010010100 | 4 |
| 27 000011011 | 0000000010100 | 3 | 0010000001010 | 3 | 0101000100100 | 3 | 1000000001010 | 3 | 1010010010100 | 5 |
| 28 000011100 | 0000000010100 | 4 | 0010000001010 | 4 | 0101000100100 | 4 | 1000000001010 | 4 | 1000010010100 | 1 |
| 29 000011101 | 0000000010100 | 5 | 0010000001010 | 5 | 0101000100100 | 5 | 1000000001010 | 5 | 1000010010100 | 2 |
| 30 000011110 | 0000000100000 | 1 | 0010000010010 | 1 | 0100001000100 | 1 | 1000000010010 | 1 | 1000010010100 | 3 |
| 31 000011111 | 0000000100000 | 2 | 0010000010010 | 2 | 0100001000100 | 2 | 1000000010010 | 2 | 1000010010100 | 4 |
| 32 000100000 | 0000000100000 | 3 | 0010000010010 | 3 | 0100001000100 | 3 | 1000000010010 | 3 | 1000010010100 | 5 |
| 33 000100001 | 0000000100000 | 4 | 0010000010010 | 4 | 0100001000100 | 4 | 1000000010010 | 4 | 1010010100100 | 1 |
| 34 000100010 | 0000000100000 | 5 | 0010000010010 | 5 | 0100001000100 | 5 | 1000000010010 | 5 | 1010010100100 | 2 |
| 35 000100011 | 0000000100010 | 1 | 0010000100010 | 1 | 0010001010100 | 1 | 1000000100010 | 1 | 1010010100100 | 3 |
| 36 000100100 | 0000000100010 | 2 | 0010000100010 | 2 | 0010001010100 | 2 | 1000000100010 | 2 | 1010010100100 | 4 |
| 37 000100101 | 0000000100010 | 3 | 0010000100010 | 3 | 0010001010100 | 3 | 1000000100010 | 3 | 1010010100100 | 5 |
| 38 000100110 | 0000000100010 | 4 | 0010000100010 | 4 | 0010001010100 | 4 | 1000000100010 | 4 | 1001001010100 | 1 |
| 39 000100111 | 0000000100010 | 5 | 0010000100010 | 5 | 0010001010100 | 5 | 1000000100010 | 5 | 1001001010100 | 2 |
| 40 000101000 | 0000000100100 | 1 | 0010000101010 | 1 | 0101001000100 | 1 | 1000000101010 | 1 | 1001001010100 | 3 |
| 41 000101001 | 0000000100100 | 2 | 0010000101010 | 2 | 0101001000100 | 2 | 1000000101010 | 2 | 1001001010100 | 4 |
| 42 000101010 | 0000000100100 | 3 | 0010000101010 | 3 | 0101001000100 | 3 | 1000000101010 | 3 | 1001001010100 | 5 |
| 43 000101011 | 0000000100100 | 4 | 0010000101010 | 4 | 0101001000100 | 4 | 1000000101010 | 4 | 1000000010100 | 1 |
| 44 000101100 | 0000000100100 | 5 | 0010000101010 | 5 | 0101001000100 | 5 | 1000000101010 | 5 | 1000000010100 | 2 |
| 45 000101101 | 0000000101000 | 1 | 0010001000010 | 1 | 0010100010100 | 1 | 1000001000010 | 1 | 1000000010100 | 3 |
| 46 000101110 | 0000000101000 | 2 | 0010001000010 | 2 | 0100010010100 | 2 | 1000001000010 | 2 | 1000000010100 | 4 |
| 47 000101111 | 0000000101000 | 3 | 0010001000010 | 3 | 0010100010100 | 3 | 1000001000010 | 3 | 1000000010100 | 5 |
| 48 000110000 | 0000000101000 | 4 | 0010001000010 | 4 | 0010100010100 | 4 | 1000001000010 | 4 | 1010100000100 | 1 |
| 49 000110001 | 0000000101000 | 5 | 0010001000010 | 5 | 0010100010100 | 5 | 1000001000010 | 5 | 1010100000100 | 2 |
| 50 000110010 | 0000000101010 | 1 | 0010001001010 | 1 | 0100001010100 | 1 | 1000001001010 | 1 | 1010100000100 | 3 |
| 51 000110011 | 0000000101010 | 2 | 0010001001010 | 2 | 0100001010100 | 2 | 1000001001010 | 2 | 1010100000100 | 4 |
| 52 000110100 | 0000000101010 | 3 | 0010001001010 | 3 | 0100001010100 | 3 | 1000001001010 | 3 | 1010100000100 | 5 |
| 53 000110101 | 0000000101010 | 4 | 0010001001010 | 4 | 0100001010100 | 4 | 1000001001010 | 4 | 1001010000100 | 1 |
| 54 000110110 | 0000000101010 | 5 | 0010001001010 | 5 | 0100001010100 | 5 | 1000001001010 | 5 | 1001010000100 | 2 |
| 55 000110111 | 0000001000001 | 1 | 0010001010010 | 1 | 0101001010100 | 1 | 1000001010010 | 1 | 1001010000100 | 3 |
| 56 000111000 | 0000001000000 | 2 | 0010001010010 | 2 | 0101001010100 | 2 | 1000001010010 | 2 | 1001010000100 | 4 |
| 57 000111001 | 0000001000000 | 3 | 0010001010010 | 3 | 0101001010100 | 3 | 1000001010010 | 3 | 1001010000100 | 5 |
| 58 000111010 | 0000001000000 | 4 | 0010001010010 | 4 | 0101001010100 | 4 | 1000001010010 | 4 | 1000101000100 | 1 |
| 59 000111011 | 0000001000000 | 5 | 0010001010010 | 5 | 0101001010100 | 5 | 1000001010010 | 5 | 1000101000100 | 2 |
| 60 000111100 | 0000001000010 | 1 | 0010010000010 | 1 | 0001010000100 | 1 | 1000010000010 | 1 | 1000101000100 | 3 |
| 61 000111101 | 0000001000010 | 2 | 0010010000010 | 2 | 0001010000100 | 2 | 1000010000010 | 2 | 1000101000100 | 4 |
| 62 000111110 | 0000001000010 | 3 | 0010010000010 | 3 | 0001010000100 | 3 | 1000010000010 | 3 | 1000101000100 | 5 |
| 63 000111111 | 0000001000010 | 4 | 0010010000010 | 4 | 0001010000100 | 4 | 1000010000010 | 4 | 1010100010100 | 1 |

FIG. 4B

| Data bits | Channel bits | state | Channel bits | state | Channel bits | state | Channel bits | state | Channel bits | state |
|---|---|---|---|---|---|---|---|---|---|---|
| 64 001000000 | 0000001000010 | 5 | 0010010000010 | 5 | 0001010000100 | 5 | 1000010000010 | 5 | 1010100010100 | 2 |
| 65 001000001 | 0000001000100 | 1 | 0010010001010 | 1 | 0101010000100 | 1 | 1000010001010 | 1 | 1010100010100 | 3 |
| 66 001000010 | 0000001000100 | 2 | 0010010001010 | 2 | 0101010000100 | 2 | 1000010001010 | 2 | 1010100010100 | 4 |
| 67 001000011 | 0000001000100 | 3 | 0010010001010 | 3 | 0101010000100 | 3 | 1000010001010 | 3 | 1010100010100 | 5 |
| 68 001000100 | 0000001000100 | 4 | 0010010001010 | 4 | 0101010000100 | 4 | 1000010001010 | 4 | 1000010100100 | 1 |
| 69 001000101 | 0000001000100 | 5 | 0010010001010 | 5 | 0101010000100 | 5 | 1000010001010 | 5 | 1000010100100 | 2 |
| 70 001000110 | 0000001001000 | 1 | 0010010010010 | 1 | 0100010000100 | 1 | 1000010010010 | 1 | 1000010100100 | 3 |
| 71 001000111 | 0000001001000 | 2 | 0010010010010 | 2 | 0100010000100 | 2 | 1000010010010 | 2 | 1000010100100 | 4 |
| 72 001001000 | 0000001001000 | 3 | 0010010010010 | 3 | 0100010000100 | 3 | 1000010010010 | 3 | 1000010100100 | 5 |
| 73 001001001 | 0000001001000 | 4 | 0010010010010 | 4 | 0100010000100 | 4 | 1000010010010 | 4 | 1010100100100 | 1 |
| 74 001001010 | 0000001001000 | 5 | 0010010010010 | 5 | 0100010000100 | 5 | 1000010010010 | 5 | 1010100100100 | 2 |
| 75 001001011 | 0000001001010 | 1 | 0010010010010 | 1 | 0010100100100 | 1 | 1000010100010 | 1 | 1010100100100 | 3 |
| 76 001001100 | 0000001001010 | 2 | 0010010100010 | 2 | 0010100100100 | 2 | 1000010100010 | 2 | 1010100100100 | 4 |
| 77 001001101 | 0000001001010 | 3 | 0010010100010 | 3 | 0010100100100 | 3 | 1000010100010 | 3 | 1010100100100 | 5 |
| 78 001001110 | 0000001001010 | 4 | 0010010100010 | 4 | 0010100100100 | 4 | 1000010100010 | 4 | 1001010010100 | 1 |
| 79 001001111 | 0000001001010 | 5 | 0010010100010 | 5 | 0010100100100 | 5 | 1000010100010 | 5 | 1001010010100 | 2 |
| 80 001010000 | 0000001010000 | 1 | 0010010101010 | 1 | 0101010010100 | 1 | 1000010101010 | 1 | 1001010010100 | 3 |
| 81 001010001 | 0000001010000 | 2 | 0010010101010 | 2 | 0101010010100 | 2 | 1000010101010 | 2 | 1001010010100 | 4 |
| 82 001010010 | 0000001010000 | 3 | 0010010101010 | 3 | 0101010010100 | 3 | 1000010101010 | 3 | 1001010010100 | 5 |
| 83 001010011 | 0000001010000 | 4 | 0010010101010 | 4 | 0101010010100 | 4 | 1000010101010 | 4 | 1000001010100 | 1 |
| 84 001010100 | 0000001010000 | 5 | 0010010101010 | 5 | 0101010010100 | 5 | 1000010101010 | 5 | 1000001010100 | 2 |
| 85 001010101 | 0000001010010 | 1 | 0010100000010 | 1 | 0010010000100 | 1 | 1000100000010 | 1 | 1000001010100 | 3 |
| 86 001010110 | 0000001010010 | 2 | 0010100000010 | 2 | 0010010000100 | 2 | 1000100000010 | 2 | 1000001010100 | 4 |
| 87 001010111 | 0000001010010 | 3 | 0010100000010 | 3 | 0010010000100 | 3 | 1000100000010 | 3 | 1000001010100 | 5 |
| 88 001011000 | 0000001010010 | 4 | 0010100000010 | 4 | 0010010000100 | 4 | 1000100000010 | 4 | 1010101000100 | 1 |
| 89 001011001 | 0000001010010 | 5 | 0010100000010 | 5 | 0010010000100 | 5 | 1000100000010 | 5 | 1010101000100 | 2 |
| 90 001011010 | 0000001010100 | 1 | 0010100001010 | 1 | 0101010100100 | 1 | 1000100001010 | 1 | 1010101000100 | 3 |
| 91 001011011 | 0000001010100 | 2 | 0010100001010 | 2 | 0101010100100 | 2 | 1000100001010 | 2 | 1010101000100 | 4 |
| 92 001011100 | 0000001010100 | 3 | 0010100001010 | 3 | 0101010100100 | 3 | 1000100001010 | 3 | 1010101000100 | 5 |
| 93 001011101 | 0000001010100 | 4 | 0010100001010 | 4 | 0101010100100 | 4 | 1000100001010 | 4 | 1001010100100 | 1 |
| 94 001011110 | 0000001010100 | 5 | 0010100001010 | 5 | 0101010100100 | 5 | 1000100001010 | 5 | 1001010100100 | 2 |
| 95 001011111 | 0000010000000 | 1 | 0010100010010 | 1 | 0100010010100 | 1 | 1000100010010 | 1 | 1001010100100 | 3 |
| 96 001100000 | 0000010000000 | 2 | 0010100010010 | 2 | 0100010010100 | 2 | 1000100010010 | 2 | 1001010100100 | 4 |
| 97 001100001 | 0000010000000 | 3 | 0010100010010 | 3 | 0100010010100 | 3 | 1000100010010 | 3 | 1001010100100 | 5 |
| 98 001100010 | 0000010000000 | 4 | 0010100010010 | 4 | 0100010010100 | 4 | 1000100010010 | 4 | 1000101010100 | 1 |
| 99 001100011 | 0000010000000 | 5 | 0010100010010 | 5 | 0100010010100 | 5 | 1000100010010 | 5 | 1000101010100 | 2 |
| 100 001100100 | 0000010000010 | 1 | 0010100100010 | 1 | 0010001001000 | 1 | 1000100100010 | 1 | 1000101010100 | 3 |
| 101 001100101 | 0000010000010 | 2 | 0010100100010 | 2 | 0010001001000 | 2 | 1000100100010 | 2 | 1000101010100 | 4 |
| 102 001100110 | 0000010000010 | 3 | 0010100100010 | 3 | 0010001001000 | 3 | 1000100100010 | 3 | 1000101010100 | 5 |
| 103 001100111 | 0000010000010 | 4 | 0010100100010 | 4 | 0010001001000 | 4 | 1000100100010 | 4 | 1010101010100 | 1 |
| 104 001101000 | 0000010000010 | 5 | 0010100100010 | 5 | 0010001001000 | 5 | 1000100100010 | 5 | 1010101010100 | 2 |
| 105 001101001 | 0000010000100 | 1 | 0010100101010 | 1 | 0100001001000 | 1 | 1000100101010 | 1 | 1010101010100 | 3 |
| 106 001101010 | 0000010000100 | 2 | 0010100101010 | 2 | 0100001001000 | 2 | 1000100101010 | 2 | 1010101010100 | 4 |
| 107 001101011 | 0000010000100 | 3 | 0010100101010 | 3 | 0100001001000 | 3 | 1000100101010 | 3 | 1010101010100 | 5 |
| 108 001101100 | 0000010000100 | 4 | 0010100101010 | 4 | 0100001001000 | 4 | 1000100101010 | 4 | 1000101001000 | 1 |
| 109 001101101 | 0000010000100 | 5 | 0010100101010 | 5 | 0100001001000 | 5 | 1000100101010 | 5 | 1000101001000 | 2 |
| 110 001101110 | 0000010001000 | 1 | 0010101000010 | 1 | 0100010001000 | 1 | 1000101000010 | 1 | 1000101001000 | 3 |
| 111 001101111 | 0000010001000 | 2 | 0010101000010 | 2 | 0100010001000 | 2 | 1000101000010 | 2 | 1000101001000 | 4 |
| 112 001110000 | 0000010001000 | 3 | 0010101000010 | 3 | 0100010001000 | 3 | 1000101000010 | 3 | 1000101001000 | 5 |
| 113 001110001 | 0000010001000 | 4 | 0010101000010 | 4 | 0100010001000 | 4 | 1000101000010 | 4 | 1000000101000 | 1 |
| 114 001110010 | 0000010001000 | 5 | 0010101000010 | 5 | 0100010001000 | 5 | 1000101000010 | 5 | 1000000101000 | 2 |
| 115 001110011 | 0000010001010 | 1 | 0010101001010 | 1 | 0010010101000 | 1 | 1000101001010 | 1 | 1000000101000 | 3 |
| 116 001110100 | 0000010001010 | 2 | 0010101001010 | 2 | 0010010101000 | 2 | 1000101001010 | 2 | 1000000101000 | 4 |
| 117 001110101 | 0000010001010 | 3 | 0010101001010 | 3 | 0010010101000 | 3 | 1000101001010 | 3 | 1000000101000 | 5 |
| 118 001110110 | 0000010001010 | 4 | 0010101001010 | 4 | 0010010101000 | 4 | 1000101001010 | 4 | 1001010001000 | 1 |
| 119 001110111 | 0000010001010 | 5 | 0010101001010 | 5 | 0010010101000 | 5 | 1000101001010 | 5 | 1001010001000 | 2 |
| 120 001111000 | 0000010010000 | 1 | 0010101010010 | 1 | 0100010001000 | 1 | 1000101010010 | 1 | 1001010001000 | 3 |
| 121 001111001 | 0000010010000 | 2 | 0010101010010 | 2 | 0100010001000 | 2 | 1000101010010 | 2 | 1001010001000 | 4 |
| 122 001111010 | 0000010010000 | 3 | 0010101010010 | 3 | 0100010001000 | 3 | 1000101010010 | 3 | 1001010001000 | 5 |
| 123 001111011 | 0000010010000 | 4 | 0010101010010 | 4 | 0100010001000 | 4 | 1000101010010 | 4 | 1010010101000 | 1 |
| 124 001111100 | 0000010010000 | 5 | 0010101010010 | 5 | 0010010001000 | 5 | 1000101010010 | 5 | 1010010101000 | 2 |
| 125 001111101 | 0000010010010 | 1 | 0100000000010 | 1 | 0101000101000 | 1 | 1001000000010 | 1 | 1010010101000 | 3 |
| 126 001111110 | 0000010010010 | 2 | 0100000000010 | 2 | 0101000101000 | 2 | 1001000000010 | 2 | 1010010101000 | 4 |
| 127 001111111 | 0000010010010 | 3 | 0100000000010 | 3 | 0101000101000 | 3 | 1001000000010 | 3 | 1010010101000 | 5 |

FIG. 4C

| Data bits | Channel bits | state | Channel bits | state | Channel bits | state | Channel bits | state | Channel bits | state |
|---|---|---|---|---|---|---|---|---|---|---|
| 128 010000000 | 0000010010010 | 4 | 0100000000010 | 4 | 0101000101000 | 4 | 1001000000010 | 4 | 1000000001000 | 1 |
| 129 010000001 | 0000010010010 | 5 | 0100000000010 | 5 | 0101000101000 | 5 | 1001000000010 | 5 | 1000000001000 | 2 |
| 130 010000010 | 0000010010100 | 1 | 0100000001010 | 1 | 0100000001000 | 1 | 1001000001010 | 1 | 1000000001000 | 3 |
| 131 010000011 | 0000010010100 | 2 | 0100000001010 | 2 | 0100000001000 | 2 | 1001000001010 | 2 | 1000000001000 | 4 |
| 132 010000100 | 0000010010100 | 3 | 0100000001010 | 3 | 0100000001000 | 3 | 1001000001010 | 3 | 1000000001000 | 5 |
| 133 010000101 | 0000010010100 | 4 | 0100000001010 | 4 | 0100000001000 | 4 | 1001000001010 | 4 | 1010000101000 | 1 |
| 134 010000110 | 0000010010100 | 5 | 0100000001010 | 5 | 0100000001000 | 5 | 1001000001010 | 5 | 1010000101000 | 2 |
| 135 010000111 | 0000010100000 | 1 | 0100000010010 | 1 | 0010100101000 | 1 | 1001000010010 | 1 | 1010000101000 | 3 |
| 136 010001000 | 0000010100000 | 2 | 0100000010010 | 2 | 0010100101000 | 2 | 1001000010010 | 2 | 1010000101000 | 4 |
| 137 010001001 | 0000010100000 | 3 | 0100000010010 | 3 | 0010100101000 | 3 | 1001000010010 | 3 | 1010000101000 | 5 |
| 138 010001010 | 0000010100000 | 4 | 0100000010010 | 4 | 0010100101000 | 4 | 1001000010010 | 4 | 1001000101000 | 1 |
| 139 010001011 | 0000010100000 | 5 | 0100000010010 | 5 | 0010100101000 | 5 | 1001000010010 | 5 | 1001000101000 | 2 |
| 140 010001100 | 0000010100010 | 1 | 0100000100010 | 1 | 0010000101000 | 1 | 1001000100010 | 1 | 1001000101000 | 3 |
| 141 010001101 | 0000010100010 | 2 | 0100000100010 | 2 | 0010000101000 | 2 | 1001000100010 | 2 | 1001000101000 | 4 |
| 142 010001110 | 0000010100010 | 3 | 0100000100010 | 3 | 0010000101000 | 3 | 1001000100010 | 3 | 1001000101000 | 5 |
| 143 010001111 | 0000010100010 | 4 | 0100000100010 | 4 | 0010000101000 | 4 | 1001000100010 | 4 | 1010100001000 | 1 |
| 144 010010000 | 0000010100010 | 5 | 0100000100010 | 5 | 0010000101000 | 5 | 1001000100010 | 5 | 1010100001000 | 2 |
| 145 010010001 | 0000010100100 | 1 | 0100000101010 | 1 | 0101001001000 | 1 | 1001000101010 | 1 | 1010100001000 | 3 |
| 146 010010010 | 0000010100100 | 2 | 0100000101010 | 2 | 0101001001000 | 2 | 1001000101010 | 2 | 1010100001000 | 4 |
| 147 010010011 | 0000010100100 | 3 | 0100000101010 | 3 | 0101001001000 | 3 | 1001000101010 | 3 | 1010100001000 | 5 |
| 148 010010100 | 0000010100100 | 4 | 0100000101010 | 4 | 0101001001000 | 4 | 1001000101010 | 4 | 1000010001000 | 1 |
| 149 010010101 | 0000010100100 | 5 | 0100000101010 | 5 | 0101001001000 | 5 | 1001000101010 | 5 | 1000010001000 | 2 |
| 150 010010110 | 0000010101000 | 1 | 0100001000010 | 1 | 0100100101000 | 1 | 1001001000010 | 1 | 1000010001000 | 3 |
| 151 010010111 | 0000010101000 | 2 | 0100001000010 | 2 | 0100100101000 | 2 | 1001001000010 | 2 | 1000010001000 | 4 |
| 152 010011000 | 0000010101000 | 3 | 0100001000010 | 3 | 0100100101000 | 3 | 1001001000010 | 3 | 1000010001000 | 5 |
| 153 010011001 | 0000010101000 | 4 | 0100001000010 | 4 | 0100100101000 | 4 | 1001001000010 | 4 | 1000100101000 | 1 |
| 154 010011010 | 0000010101000 | 5 | 0100001000010 | 5 | 0100100101000 | 5 | 1001001000010 | 5 | 1000100101000 | 2 |
| 155 010011011 | 0000010101010 | 1 | 0100001001010 | 1 | 0100010001000 | 1 | 1001001001010 | 1 | 1000100101000 | 3 |
| 156 010011100 | 0000010101010 | 2 | 0100001001010 | 2 | 0100010001000 | 2 | 1001001001010 | 2 | 1000100101000 | 4 |
| 157 010011101 | 0000010101010 | 3 | 0100001001010 | 3 | 0100010001000 | 3 | 1001001001010 | 3 | 1000100101000 | 5 |
| 158 010011110 | 0000010101010 | 4 | 0100001001010 | 4 | 0100010001000 | 4 | 1001001001010 | 4 | 1010001001000 | 1 |
| 159 010011111 | 0000010101010 | 5 | 0100001001010 | 5 | 0100010001000 | 5 | 1001001001010 | 5 | 1010001001000 | 2 |
| 160 010100000 | 0000100000000 | 1 | 0100001010010 | 1 | 0010000001000 | 1 | 1001001010010 | 1 | 1010001001000 | 3 |
| 161 010100001 | 0000100000000 | 2 | 0100001010010 | 2 | 0010000001000 | 2 | 1001001010010 | 2 | 1010001001000 | 4 |
| 162 010100010 | 0000100000000 | 3 | 0100001010010 | 3 | 0010000001000 | 3 | 1001001010010 | 3 | 1010001001000 | 5 |
| 163 010100011 | 0000100000000 | 4 | 0100001010010 | 4 | 0010000001000 | 4 | 1001001010010 | 4 | 1000100001000 | 1 |
| 164 010100100 | 0000100000000 | 5 | 0100001010010 | 5 | 0010000001000 | 5 | 1001001010010 | 5 | 1000100001000 | 2 |
| 165 010100101 | 0000100000010 | 1 | 0100010000010 | 1 | 0010100001000 | 1 | 1001010000010 | 1 | 1000100001000 | 3 |
| 166 010100110 | 0000100000010 | 2 | 0100010000010 | 2 | 0010100001000 | 2 | 1001010000010 | 2 | 1000100001000 | 4 |
| 167 010100111 | 0000100000010 | 3 | 0100010000010 | 3 | 0010100001000 | 3 | 1001010000010 | 3 | 1000100001000 | 5 |
| 168 010101000 | 0000100000010 | 4 | 0100010000010 | 4 | 0010100001000 | 4 | 1001010000010 | 4 | 1001010101000 | 1 |
| 169 010101001 | 0000100000010 | 5 | 0100010000010 | 5 | 0010100001000 | 5 | 1001010000010 | 5 | 1001010101000 | 2 |
| 170 010101010 | 0000100000100 | 1 | 0100010001010 | 1 | 0100101001000 | 1 | 1001010001010 | 1 | 1001010101000 | 3 |
| 171 010101011 | 0000100000100 | 2 | 0100010001010 | 2 | 0100101001000 | 2 | 1001010001010 | 2 | 1001010101000 | 4 |
| 172 010101100 | 0000100000100 | 3 | 0100010001010 | 3 | 0100101001000 | 3 | 1001010001010 | 3 | 1001010101000 | 5 |
| 173 010101101 | 0000100000100 | 4 | 0100010001010 | 4 | 0100101001000 | 4 | 1001010001010 | 4 | 1010100101000 | 1 |
| 174 010101110 | 0000100000100 | 5 | 0100010001010 | 5 | 0100101001000 | 5 | 1001010001010 | 5 | 1010100101000 | 2 |
| 175 010101111 | 0000100001000 | 1 | 0100010010010 | 1 | 0101010001000 | 1 | 1001010010010 | 1 | 1010100101000 | 3 |
| 176 010110000 | 0000100001000 | 2 | 0100010010010 | 2 | 0101010001000 | 2 | 1001010010010 | 2 | 1010100101000 | 4 |
| 177 010110001 | 0000100001000 | 3 | 0100010010010 | 3 | 0101010001000 | 3 | 1001010010010 | 3 | 1010100101000 | 5 |
| 178 010110010 | 0000100001000 | 4 | 0100010010010 | 4 | 0101010001000 | 4 | 1001010010010 | 4 | 1001001001000 | 1 |
| 179 010110011 | 0000100001000 | 5 | 0100010010010 | 5 | 0101010001000 | 5 | 1001010010010 | 5 | 1001001001000 | 2 |
| 180 010110100 | 0000100001010 | 1 | 0100010100010 | 1 | 0010101001000 | 1 | 1001010100010 | 1 | 1001001001000 | 3 |
| 181 010110101 | 0000100001010 | 2 | 0100010100010 | 2 | 0010101001000 | 2 | 1001010100010 | 2 | 1001001001000 | 4 |
| 182 010110110 | 0000100001010 | 3 | 0100010100010 | 3 | 0010101001000 | 3 | 1001010100010 | 3 | 1001001001000 | 5 |
| 183 010110111 | 0000100001010 | 4 | 0100010100010 | 4 | 0010101001000 | 4 | 1001010100010 | 4 | 1001000001000 | 1 |
| 184 010111000 | 0000100001010 | 5 | 0100010100010 | 5 | 0010101001000 | 5 | 1001010100010 | 5 | 1001000001000 | 2 |
| 185 010111001 | 0000100010000 | 1 | 0100010101010 | 1 | 0100000101000 | 1 | 1001010101010 | 1 | 1001000001000 | 3 |
| 186 010111010 | 0000100010000 | 2 | 0100010101010 | 2 | 0100000101000 | 2 | 1001010101010 | 2 | 1001000001000 | 4 |
| 187 010111011 | 0000100010000 | 3 | 0100010101010 | 3 | 0100000101000 | 3 | 1001010101010 | 3 | 1001000001000 | 5 |
| 188 010111100 | 0000100010000 | 4 | 0100010101010 | 4 | 0100010101000 | 4 | 1001010101010 | 4 | 1001001001000 | 1 |
| 189 010111101 | 0000100010000 | 5 | 0100010101010 | 5 | 0100010101000 | 5 | 1001010101010 | 5 | 1000001001000 | 2 |
| 190 010111110 | 0000100010010 | 1 | 0100100000010 | 1 | 0001010101000 | 1 | 1010000000010 | 1 | 1000001001000 | 3 |
| 191 010111111 | 0000100010010 | 2 | 0100100000010 | 2 | 0001010101000 | 2 | 1010000000010 | 2 | 1000001001000 | 4 |

FIG. 4D

| Data bits | Channel bits | state | Channel bits | state | Channel bits | state | Channel bits | state | Channel bits | state |
|---|---|---|---|---|---|---|---|---|---|---|
| 192 011000000 | 0000100010010 | 3 | 0100100000010 | 3 | 0001010101000 | 3 | 1010000000010 | 3 | 1000001001000 | 5 |
| 193 011000001 | 0000100010010 | 4 | 0100100000010 | 4 | 0001010101000 | 4 | 1010000000010 | 4 | 1010101001000 | 1 |
| 194 011000010 | 0000100010010 | 5 | 0100100000010 | 5 | 0001010101000 | 5 | 1010000000010 | 5 | 1010101001000 | 2 |
| 195 011000011 | 0000100010100 | 1 | 0100100001010 | 1 | 0100010101000 | 1 | 1010000001010 | 1 | 1010101001000 | 3 |
| 196 011000100 | 0000100010100 | 2 | 0100100001010 | 2 | 0100010101000 | 2 | 1010000001010 | 2 | 1010101001000 | 4 |
| 197 011000101 | 0000100010100 | 3 | 0100100001010 | 3 | 0100010101000 | 3 | 1010000001010 | 3 | 1010101001000 | 5 |
| 198 011000110 | 0000100010100 | 4 | 0100100001010 | 4 | 0100010101000 | 4 | 1010000001010 | 4 | 1010010001000 | 1 |
| 199 011000111 | 0000100010100 | 5 | 0100100001010 | 5 | 0100010101000 | 5 | 1010000001010 | 5 | 1010010001000 | 2 |
| 200 011001000 | 0000100100000 | 1 | 0100100010010 | 1 | 0001010001000 | 1 | 1010000010010 | 1 | 1010010001000 | 3 |
| 201 011001001 | 0000100100000 | 2 | 0100100010010 | 2 | 0001010001000 | 2 | 1010000010010 | 2 | 1010010001000 | 4 |
| 202 011001010 | 0000100100000 | 3 | 0100100010010 | 3 | 0001010001000 | 3 | 1010000010010 | 3 | 1010010001000 | 5 |
| 203 011001011 | 0000100100000 | 4 | 0100100010010 | 4 | 0001010001000 | 4 | 1010000010010 | 4 | 1010000001000 | 1 |
| 204 011001100 | 0000100100000 | 5 | 0100100010010 | 5 | 0001010001000 | 5 | 1010000010010 | 5 | 1010000001000 | 2 |
| 205 011001101 | 0000100100010 | 1 | 0100100100010 | 1 | 0101010101000 | 1 | 1010000100010 | 1 | 1010000001000 | 3 |
| 206 011001110 | 0000100100010 | 2 | 0100100100010 | 2 | 0101010101000 | 2 | 1010000100010 | 2 | 1010000001000 | 4 |
| 207 011001111 | 0000100100010 | 3 | 0100100100010 | 3 | 0101010101000 | 3 | 1010000100010 | 3 | 1010000001000 | 5 |
| 208 011010000 | 0000100100010 | 4 | 0100100100010 | 4 | 0101010101000 | 4 | 1010000100010 | 4 | 1000010101000 | 1 |
| 209 011010001 | 0000100100010 | 5 | 0100100100010 | 5 | 0101010101000 | 5 | 1010000100010 | 5 | 1000010101000 | 2 |
| 210 011010010 | 0000100100100 | 1 | 0100100101010 | 1 | 0101000001000 | 1 | 1010000101010 | 1 | 1000010101000 | 3 |
| 211 011010011 | 0000100100100 | 2 | 0100100101010 | 2 | 0101000001000 | 2 | 1010000101010 | 2 | 1000010101000 | 4 |
| 212 011010100 | 0000100100100 | 3 | 0100100101010 | 3 | 0101000001000 | 3 | 1010000101010 | 3 | 1000010101000 | 5 |
| 213 011010101 | 0000100100100 | 4 | 0100100101010 | 4 | 0101000001000 | 4 | 1010000101010 | 4 | 1010010010000 | 1 |
| 214 011010110 | 0000100100100 | 5 | 0100100101010 | 5 | 0101000001000 | 5 | 1010000101010 | 5 | 1010010010000 | 2 |
| 215 011010111 | 0000100101000 | 1 | 0100101000010 | 1 | 0101001010000 | 1 | 1010001000010 | 1 | 1010010010000 | 3 |
| 216 011011000 | 0000100101000 | 2 | 0100101000010 | 2 | 0101001010000 | 2 | 1010001000010 | 2 | 1010010010000 | 4 |
| 217 011011001 | 0000100101000 | 3 | 0100101000010 | 3 | 0101001010000 | 3 | 1010001000010 | 3 | 1010010010000 | 5 |
| 218 011011010 | 0000100101000 | 4 | 0100101000010 | 4 | 0101001010000 | 4 | 1010001000010 | 4 | 1000000010000 | 1 |
| 219 011011011 | 0000100101000 | 5 | 0100101000010 | 5 | 0101001010000 | 5 | 1010001000010 | 5 | 1000000010000 | 2 |
| 220 011011100 | 0000100101010 | 1 | 0100101001010 | 1 | 0010001010000 | 1 | 1010001001010 | 1 | 1000000010000 | 3 |
| 221 011011101 | 0000100101010 | 2 | 0100101001010 | 2 | 0010001010000 | 2 | 1010001001010 | 2 | 1000000010000 | 4 |
| 222 011011110 | 0000100101010 | 3 | 0100101001010 | 3 | 0010001010000 | 3 | 1010001001010 | 3 | 1000000010000 | 5 |
| 223 011011111 | 0000100101010 | 4 | 0100101001010 | 4 | 0010001010000 | 4 | 1010001001010 | 4 | 1010000010000 | 1 |
| 224 011100000 | 0000100101010 | 5 | 0100101001010 | 5 | 0010001010000 | 5 | 1010001001010 | 5 | 1010000010000 | 2 |
| 225 011100001 | 0000101000000 | 1 | 0100101010010 | 1 | 0101000010000 | 1 | 1010001010010 | 1 | 1010000010000 | 3 |
| 226 011100010 | 0000101000000 | 2 | 0100101010010 | 2 | 0101000010000 | 2 | 1010001010010 | 2 | 1010000010000 | 4 |
| 227 011100011 | 0000101000000 | 3 | 0100101010010 | 3 | 0101000010000 | 3 | 1010001010010 | 3 | 1010000010000 | 5 |
| 228 011100100 | 0000101000000 | 4 | 0100101010010 | 4 | 0101000010000 | 4 | 1010001010010 | 4 | 1001000010000 | 1 |
| 229 011100101 | 0000101000000 | 5 | 0100101010010 | 5 | 0101000010000 | 5 | 1010001010010 | 5 | 1001000010000 | 2 |
| 230 011100110 | 0000101000010 | 1 | 0101000000010 | 1 | 0010010010000 | 1 | 1010010000010 | 1 | 1001000010000 | 3 |
| 231 011100111 | 0000101000010 | 2 | 0101000000010 | 2 | 0010010010000 | 2 | 1010010000010 | 2 | 1001000010000 | 4 |
| 232 011101000 | 0000101000010 | 3 | 0101000000010 | 3 | 0010010010000 | 3 | 1010010000010 | 3 | 1001000010000 | 5 |
| 233 011101001 | 0000101000010 | 4 | 0101000000010 | 4 | 0010010010000 | 4 | 1010010000010 | 4 | 1010001010000 | 1 |
| 234 011101010 | 0000101000010 | 5 | 0101000000010 | 5 | 0010010010000 | 5 | 1010010000010 | 5 | 1010001010000 | 2 |
| 235 011101011 | 0000101000100 | 1 | 0101000001010 | 1 | 0100010010000 | 1 | 1010010001010 | 1 | 1010001010000 | 3 |
| 236 011101100 | 0000101000100 | 2 | 0101000001010 | 2 | 0100010010000 | 2 | 1010010001010 | 2 | 1010001010000 | 4 |
| 237 011101101 | 0000101000100 | 3 | 0101000001010 | 3 | 0100010010000 | 3 | 1010010001010 | 3 | 1010001010000 | 5 |
| 238 011101110 | 0000101000100 | 4 | 0101000001010 | 4 | 0100010010000 | 4 | 1010010001010 | 4 | 1000100010000 | 1 |
| 239 011101111 | 0000101000100 | 5 | 0101000001010 | 5 | 0100010010000 | 5 | 1010010001010 | 5 | 1000100010000 | 2 |
| 240 011110000 | 0000101001000 | 1 | 0101000010010 | 1 | 0001010010000 | 1 | 1010010010010 | 1 | 1000100010000 | 3 |
| 241 011110001 | 0000101001000 | 2 | 0101000010010 | 2 | 0001010010000 | 2 | 1010010010010 | 2 | 1000100010000 | 4 |
| 242 011110010 | 0000101001000 | 3 | 0101000010010 | 3 | 0001010010000 | 3 | 1010010010010 | 3 | 1000100010000 | 5 |
| 243 011110011 | 0000101001000 | 4 | 0101000010010 | 4 | 0001010010000 | 4 | 1010010010010 | 4 | 1000001010000 | 1 |
| 244 011110100 | 0000101001000 | 5 | 0101000010010 | 5 | 0001010010000 | 5 | 1010010010010 | 5 | 1000001010000 | 2 |
| 245 011110101 | 0000101001010 | 1 | 0101000100010 | 1 | 0100100010000 | 1 | 1010010100010 | 1 | 1000001010000 | 3 |
| 246 011110110 | 0000101001010 | 2 | 0101000100010 | 2 | 0100100010000 | 2 | 1010010100010 | 2 | 1000001010000 | 4 |
| 247 011110111 | 0000101001010 | 3 | 0101000100010 | 3 | 0100100010000 | 3 | 1010010100010 | 3 | 1000001010000 | 5 |
| 248 011111000 | 0000101001010 | 4 | 0101000100010 | 4 | 0100100010000 | 4 | 1010010100010 | 4 | 1000100010000 | 1 |
| 249 011111001 | 0000101001010 | 5 | 0101000100010 | 5 | 0100100010000 | 5 | 1010010100010 | 5 | 1000100010000 | 2 |
| 250 011111010 | 0000101010000 | 1 | 0101000101010 | 1 | 0101010010000 | 1 | 1010010101010 | 1 | 1000010010000 | 3 |
| 251 011111011 | 0000101010000 | 2 | 0101000101010 | 2 | 0101010010000 | 2 | 1010010101010 | 2 | 1000010010000 | 4 |
| 252 011111100 | 0000101010000 | 3 | 0101000101010 | 3 | 0101010010000 | 3 | 1010010101010 | 3 | 1000010010000 | 5 |
| 253 011111101 | 0000101010000 | 4 | 0101000101010 | 4 | 0101010010000 | 4 | 1010010101010 | 4 | 1000101010000 | 1 |
| 254 011111110 | 0000101010000 | 5 | 0101000101010 | 5 | 0101010101000 | 5 | 1010010101010 | 5 | 1000101010000 | 2 |
| 255 011111111 | 0000101010010 | 1 | 0101001000010 | 1 | 0100101010000 | 1 | 1010100000010 | 1 | 1000101010000 | 3 |

FIG. 4E

| Data bits | Channel bits | state | Channel bits | state | Channel bits | state | Channel bits | state | Channel bits | state |
|---|---|---|---|---|---|---|---|---|---|---|
| 256 100000000 | 0000101010010 | 2 | 0101001000010 | 2 | 0100101010000 | 2 | 1010100000010 | 2 | 1000101010000 | 4 |
| 257 100000001 | 0000101010010 | 3 | 0101001000010 | 3 | 0100101010000 | 3 | 1010100000010 | 3 | 1000101010000 | 5 |
| 258 100000010 | 0000101010010 | 4 | 0101001000010 | 4 | 0100101010000 | 4 | 1010100000010 | 4 | 1001010010000 | 1 |
| 259 100000011 | 0000101010010 | 5 | 0101001000010 | 5 | 0100101010000 | 5 | 1010100000010 | 5 | 1001010010000 | 2 |
| 260 100000100 | 0000101010100 | 1 | 0101001001010 | 1 | 0100001010000 | 1 | 1010100001010 | 1 | 1001010010000 | 3 |
| 261 100000101 | 0000101010100 | 2 | 0101001001010 | 2 | 0100001010000 | 2 | 1010100001010 | 2 | 1001010010000 | 4 |
| 262 100000110 | 0000101010100 | 3 | 0101001001010 | 3 | 0100001010000 | 3 | 1010100001010 | 3 | 1001010010000 | 5 |
| 263 100000111 | 0000101010100 | 4 | 0101001001010 | 4 | 0100001010000 | 4 | 1010100001010 | 4 | 1010101010000 | 1 |
| 264 100001000 | 0000101010100 | 5 | 0101001001010 | 5 | 0100001010000 | 5 | 1010100001010 | 5 | 1010101010000 | 2 |
| 265 100001001 | 0001000000000 | 1 | 0101001010010 | 1 | 0010000010000 | 1 | 1010100010010 | 1 | 1010101010000 | 3 |
| 266 100001010 | 0001000000000 | 2 | 0101001010010 | 2 | 0010000010000 | 2 | 1010100010010 | 2 | 1010101010000 | 4 |
| 267 100001011 | 0001000000000 | 3 | 0101001010010 | 3 | 0010000010000 | 3 | 1010100010010 | 3 | 1010101010000 | 5 |
| 268 100001100 | 0001000000000 | 4 | 0101001010010 | 4 | 0010000010000 | 4 | 1010100010010 | 4 | 1001001010000 | 1 |
| 269 100001101 | 0001000000000 | 5 | 0101001010010 | 5 | 0010000010000 | 5 | 1010100010010 | 5 | 1001001010000 | 2 |
| 270 100001110 | 0001000000010 | 1 | 0101010000010 | 1 | 0010100010000 | 1 | 1010100100010 | 1 | 1001001010000 | 3 |
| 271 100001111 | 0001000000010 | 2 | 0101010000010 | 2 | 0010100010000 | 2 | 1010100100010 | 2 | 1001001010000 | 4 |
| 272 100010000 | 0001000000010 | 3 | 0101010000010 | 3 | 0010100010000 | 3 | 1010100100010 | 3 | 1001001010000 | 5 |
| 273 100010001 | 0001000000010 | 4 | 0101010000010 | 4 | 0010100010000 | 4 | 1010100100010 | 4 | 1010100010000 | 1 |
| 274 100010010 | 0001000000010 | 5 | 0101010000010 | 5 | 0010100010000 | 5 | 1010100100010 | 5 | 1010100010000 | 2 |
| 275 100010011 | 0001000000100 | 1 | 0101010001010 | 1 | 0010101010000 | 1 | 1010100101010 | 1 | 1010100010000 | 3 |
| 276 100010100 | 0001000000100 | 2 | 0101010001010 | 2 | 0010101010000 | 2 | 1010100101010 | 2 | 1010100010000 | 4 |
| 277 100010101 | 0001000000100 | 3 | 0101010001010 | 3 | 0010101010000 | 3 | 1010100101010 | 3 | 1010100010000 | 5 |
| 278 100010110 | 0001000000100 | 4 | 0101010001010 | 4 | 0010101010000 | 4 | 1010100101010 | 4 | 1001000100000 | 1 |
| 279 100010111 | 0001000000100 | 5 | 0101010001010 | 5 | 0010101010000 | 5 | 1010100101010 | 5 | 1001000100000 | 2 |
| 280 100011000 | 0001000001000 | 1 | 0101010010010 | 1 | 0100000010000 | 1 | 1010101000010 | 1 | 1001000100000 | 3 |
| 281 100011001 | 0001000001000 | 2 | 0101010010010 | 2 | 0100000010000 | 2 | 1010101000010 | 2 | 1001000100000 | 4 |
| 282 100011010 | 0001000001000 | 3 | 0101010010010 | 3 | 0100000010000 | 3 | 1010101000010 | 3 | 1001000100000 | 5 |
| 283 100011011 | 0001000001000 | 4 | 0101010010010 | 4 | 0100000010000 | 4 | 1010101000010 | 4 | 1000010100000 | 1 |
| 284 100011100 | 0001000001000 | 5 | 0101010010010 | 5 | 0100000010000 | 5 | 1010101000010 | 5 | 1000010100000 | 2 |
| 285 100011101 | 0001000001010 | 1 | 0101010100010 | 1 | 0010000100000 | 1 | 1010101001010 | 1 | 1000010100000 | 3 |
| 286 100011110 | 0001000001010 | 2 | 0101010100010 | 2 | 0010000100000 | 2 | 1010101001010 | 2 | 1000010100000 | 4 |
| 287 100011111 | 0001000001010 | 3 | 0101010100010 | 3 | 0010000100000 | 3 | 1010101001010 | 3 | 1000010100000 | 5 |
| 288 100100000 | 0001000001010 | 4 | 0101010100010 | 4 | 0010000100000 | 4 | 1010101001010 | 4 | 1000000100000 | 1 |
| 289 100100001 | 0001000001010 | 5 | 0101010100010 | 5 | 0010000100000 | 5 | 1010101001010 | 5 | 1000000100000 | 2 |
| 290 100100010 | 0001000010000 | 1 | 0101010101010 | 1 | 0101000100000 | 1 | 1010101010010 | 1 | 1000000100000 | 3 |
| 291 100100011 | 0001000010000 | 2 | 0101010101010 | 2 | 0101000100000 | 2 | 1010101010010 | 2 | 1000000100000 | 4 |
| 292 100100100 | 0001000010000 | 3 | 0101010101010 | 3 | 0101000100000 | 3 | 1010101010010 | 3 | 1000000100000 | 5 |
| 293 100100101 | 0001000010000 | 4 | 0101010101010 | 4 | 0101000100000 | 4 | 1010101010010 | 4 | 1001010100000 | 1 |
| 294 100100110 | 0001000010000 | 5 | 0101010101010 | 5 | 0101000100000 | 5 | 1010101010010 | 5 | 1001010100000 | 2 |
| 295 100100111 | 0001000010010 | 1 | 0010000100100 | 1 | 0010100100000 | 1 | 1000000000100 | 1 | 1001010100000 | 3 |
| 296 100101000 | 0001000010010 | 2 | 0010000100100 | 2 | 0010100100000 | 2 | 1000000000100 | 2 | 1001010100000 | 4 |
| 297 100101001 | 0001000010010 | 3 | 0010000100100 | 3 | 0010100100000 | 3 | 1000000000100 | 3 | 1001010100000 | 5 |
| 298 100101010 | 0001000010010 | 4 | 0010000100100 | 4 | 0010100100000 | 4 | 1000000000100 | 4 | 1010100100000 | 1 |
| 299 100101011 | 0001000010010 | 5 | 0010000100100 | 5 | 0010100100000 | 5 | 1000000000100 | 5 | 1010100100000 | 2 |
| 300 100101100 | 0001000010100 | 1 | 0100001000100 | 1 | 0010010100000 | 1 | 1010100000100 | 1 | 1010100100000 | 3 |
| 301 100101101 | 0001000010100 | 2 | 0100001000100 | 2 | 0010010100000 | 2 | 1010000000100 | 2 | 1010100100000 | 4 |
| 302 100101110 | 0001000010100 | 3 | 0100001000100 | 3 | 0010010100000 | 3 | 1010000000100 | 3 | 1010100100000 | 5 |
| 303 100101111 | 0001000010100 | 4 | 0100001000100 | 4 | 0010010100000 | 4 | 1010000000100 | 4 | 1000100100000 | 1 |
| 304 100110000 | 0001000010100 | 5 | 0100001000100 | 5 | 0010010100000 | 5 | 1010000000100 | 5 | 1000100100000 | 2 |
| 305 100110001 | 0001000100000 | 1 | 0100101000100 | 1 | 0101010100000 | 1 | 1001000000100 | 1 | 1000100100000 | 3 |
| 306 100110010 | 0001000100000 | 2 | 0010101000100 | 2 | 0101010100000 | 2 | 1001000000100 | 2 | 1000100100000 | 4 |
| 307 100110011 | 0001000100000 | 3 | 0010101000100 | 3 | 0101010100000 | 3 | 1001000000100 | 3 | 1000100100000 | 5 |
| 308 100110100 | 0001000100000 | 4 | 0010101000100 | 4 | 0101010100000 | 4 | 1001000000100 | 4 | 1010000100000 | 1 |
| 309 100110101 | 0001000100000 | 5 | 0010101000100 | 5 | 0101010100000 | 5 | 1001000000100 | 5 | 1010000100000 | 2 |
| 310 100110110 | 0001000100010 | 1 | 0010000000100 | 1 | 0100100100000 | 1 | 1000100000100 | 1 | 1010000100000 | 3 |
| 311 100110111 | 0001000100010 | 2 | 0010000000100 | 2 | 0100100100000 | 2 | 1000100000100 | 2 | 1010000100000 | 4 |
| 312 100111000 | 0001000100010 | 3 | 0010000000100 | 3 | 0100100100000 | 3 | 1000100000100 | 3 | 1010000100000 | 5 |
| 313 100111001 | 0001000100010 | 4 | 0010000000100 | 4 | 0100100100000 | 4 | 1000100000100 | 4 | 1010010100000 | 1 |
| 314 100111010 | 0001000100010 | 5 | 0010000000100 | 5 | 0100100100000 | 5 | 1000100000100 | 5 | 1010010100000 | 2 |
| 315 100111011 | 0001000100100 | 1 | 0100100000100 | 1 | 0100010100000 | 1 | 1010000010100 | 1 | 1010010100000 | 3 |
| 316 100111100 | 0001000100100 | 2 | 0100100000100 | 2 | 0100010100000 | 2 | 1010000010100 | 2 | 1010010100000 | 4 |
| 317 100111101 | 0001000100100 | 3 | 0100100000100 | 3 | 0100010100000 | 3 | 1010000010100 | 3 | 1010010100000 | 5 |
| 318 100111110 | 0001000100100 | 4 | 0100100000100 | 4 | 0100010100000 | 4 | 1010000010100 | 4 | 1001001000000 | 1 |
| 319 100111111 | 0001000100100 | 5 | 0100100000100 | 5 | 0100010100000 | 5 | 1010000010100 | 5 | 1001001000000 | 2 |

FIG. 4F

| Data bits | Channel bits | state | Channel bits | state | Channel bits | state | Channel bits | state | Channel bits | state |
|---|---|---|---|---|---|---|---|---|---|---|
| 320 101000000 | 0001000101000 | 1 | 0010010010100 | 1 | 0001010100000 | 1 | 1000010000100 | 1 | 1001001000000 | 3 |
| 321 101000001 | 0001000101000 | 2 | 0010010010100 | 2 | 0001010100000 | 2 | 1000010000100 | 2 | 1001001000000 | 4 |
| 322 101000010 | 0001000101000 | 3 | 0010010010100 | 3 | 0001010100000 | 3 | 1000010000100 | 3 | 1001001000000 | 5 |
| 323 101000011 | 0001000101000 | 4 | 0010010010100 | 4 | 0001010100000 | 4 | 1000010000100 | 4 | 1000101000000 | 1 |
| 324 101000100 | 0001000101000 | 5 | 0010010010100 | 5 | 0001010100000 | 5 | 1000010000100 | 5 | 1000101000000 | 2 |
| 325 101000101 | 0001000101010 | 1 | 0010101010100 | 1 | 0100000100000 | 1 | 1010000100100 | 1 | 1000101000000 | 3 |
| 326 101000110 | 0001000101010 | 2 | 0010101010100 | 2 | 0100000100000 | 2 | 1010000100100 | 2 | 1000101000000 | 4 |
| 327 101000111 | 0001000101010 | 3 | 0010101010100 | 3 | 0100000100000 | 3 | 1010000100100 | 3 | 1000101000000 | 5 |
| 328 101001000 | 0001000101010 | 4 | 0010101010100 | 4 | 0100000100000 | 4 | 1010000100100 | 4 | 1010101000000 | 1 |
| 329 101001001 | 0001000101010 | 5 | 0010101010100 | 5 | 0100000100000 | 5 | 1010000100100 | 5 | 1010101000000 | 2 |
| 330 101001010 | 0001001000000 | 1 | 0100100010100 | 1 | 0010001000000 | 1 | 1001000010100 | 1 | 1010101000000 | 3 |
| 331 101001011 | 0001001000000 | 2 | 0100100010100 | 2 | 0101001000000 | 2 | 1001000010100 | 2 | 1010101000000 | 4 |
| 332 101001100 | 0001001000000 | 3 | 0100100010100 | 3 | 0101001000000 | 3 | 1001000010100 | 3 | 1010101000000 | 5 |
| 333 101001101 | 0001001000000 | 4 | 0100100010100 | 4 | 0101001000000 | 4 | 1001000010100 | 4 | 1010001000000 | 1 |
| 334 101001110 | 0001001000000 | 5 | 0100100010100 | 5 | 0101001000000 | 5 | 1001000010100 | 5 | 1010001000000 | 2 |
| 335 101001111 | 0001001000010 | 1 | 0001010100100 | 1 | 0100101000000 | 1 | 1000001000100 | 1 | 1010001000000 | 3 |
| 336 101010000 | 0001001000010 | 2 | 0001010100100 | 2 | 0100101000000 | 2 | 1000001000100 | 2 | 1010001000000 | 4 |
| 337 101010001 | 0001001000010 | 3 | 0001010100100 | 3 | 0100101000000 | 3 | 1000001000100 | 3 | 1010001000000 | 5 |
| 338 101010010 | 0001001000010 | 4 | 0001010100100 | 4 | 0100101000000 | 4 | 1000001000100 | 4 | 1000001000000 | 1 |
| 339 101010011 | 0001001000010 | 5 | 0001010100100 | 5 | 0100101000000 | 5 | 1000001000100 | 5 | 1000001000000 | 2 |
| 340 101010100 | 0001001000100 | 1 | 0010100100100 | 1 | 0010001000000 | 1 | 1010001000100 | 1 | 1000001000000 | 3 |
| 341 101010101 | 0001001000100 | 2 | 0010100100100 | 2 | 0010001000000 | 2 | 1010001000100 | 2 | 1000001000000 | 4 |
| 342 101010110 | 0001001000100 | 3 | 0010100100100 | 3 | 0010001000000 | 3 | 1010001000100 | 3 | 1000001000000 | 5 |
| 343 101010111 | 0001001000100 | 4 | 0010100100100 | 4 | 0010001000000 | 4 | 1010001000100 | 4 | 1010010000000 | 1 |
| 344 101011000 | 0001001000100 | 5 | 0010100100100 | 5 | 0010001000000 | 5 | 1010001000100 | 5 | 1010010000000 | 2 |
| 345 101011001 | 0001001001000 | 1 | 0100000000100 | 1 | 0100001000000 | 1 | 1001000100100 | 1 | 1010010000000 | 3 |
| 346 101011010 | 0001001001000 | 2 | 0100000000100 | 2 | 0100001000000 | 2 | 1001000100100 | 2 | 1010010000000 | 4 |
| 347 101011011 | 0001001001000 | 3 | 0100000000100 | 3 | 0100001000000 | 3 | 1001000100100 | 3 | 1010010000000 | 5 |
| 348 101011100 | 0001001001000 | 4 | 0100000000100 | 4 | 0100001000000 | 4 | 1001000100100 | 4 | 1000010000000 | 1 |
| 349 101011101 | 0001001001000 | 5 | 0100000000100 | 5 | 0100001000000 | 5 | 1001000100100 | 5 | 1000010000000 | 2 |
| 350 101011110 | 0001001001010 | 1 | 0010010100100 | 1 | 0010101000000 | 1 | 1000100010100 | 1 | 1000010000000 | 3 |
| 351 101011111 | 0001001001010 | 2 | 0010010100100 | 2 | 0010101000000 | 2 | 1000100010100 | 2 | 1000010000000 | 4 |
| 352 101100000 | 0001001001010 | 3 | 0010010100100 | 3 | 0010100010000 | 3 | 1000100010100 | 3 | 1000010000000 | 5 |
| 353 101100001 | 0001001001010 | 4 | 0010010100100 | 4 | 0010101000000 | 4 | 1000100010100 | 4 | 1001010000000 | 1 |
| 354 101100010 | 0001001001010 | 5 | 0010010100100 | 5 | 0010101000000 | 5 | 1000100010100 | 5 | 1001010000000 | 2 |
| 355 101100011 | 0001001010000 | 1 | 0100101000100 | 1 | 0010010000000 | 1 | 1010001010100 | 1 | 1001010000000 | 3 |
| 356 101100100 | 0001001010000 | 2 | 0100101000100 | 2 | 0010010000000 | 2 | 1010001010100 | 2 | 1001010000000 | 4 |
| 357 101100101 | 0001001010000 | 3 | 0100101000100 | 3 | 0010010000000 | 3 | 1010001010100 | 3 | 1001010000000 | 5 |
| 358 101100110 | 0001001010000 | 4 | 0100101000100 | 4 | 0010010000000 | 4 | 1010001010100 | 4 | 1000100000000 | 1 |
| 359 101100111 | 0001001010000 | 5 | 0100101000100 | 5 | 0010010000000 | 5 | 1010001010100 | 5 | 1000100000000 | 2 |
| 360 101101000 | 0001001010010 | 1 | 0010001000100 | 1 | 0100010000000 | 1 | 1000000100100 | 1 | 1000100000000 | 3 |
| 361 101101001 | 0001001010010 | 2 | 0010001000100 | 2 | 0100010000000 | 2 | 1000000100100 | 2 | 1000100000000 | 4 |
| 362 101101010 | 0001001010010 | 3 | 0010001000100 | 3 | 0100010000000 | 3 | 1000000100100 | 3 | 1000100000000 | 5 |
| 363 101101011 | 0001001010010 | 4 | 0010001000100 | 4 | 0100010000000 | 4 | 1000000100100 | 4 | 1010100000000 | 1 |
| 364 101101100 | 0001001010010 | 5 | 0010001000100 | 5 | 0100010000000 | 5 | 1000000100100 | 5 | 1010100000000 | 2 |
| 365 101101101 | 0001001010100 | 1 | 0100000010100 | 1 | 0101010000000 | 1 | 1010010000100 | 1 | 1010100000000 | 3 |
| 366 101101110 | 0001001010100 | 2 | 0100000010100 | 2 | 0101010000000 | 2 | 1010010000100 | 2 | 1010100000000 | 4 |
| 367 101101111 | 0001001010100 | 3 | 0100000010100 | 3 | 0101010000000 | 3 | 1010010000100 | 3 | 1010100000000 | 5 |
| 368 101110000 | 0001001010100 | 4 | 0100000010100 | 4 | 0101010000000 | 4 | 1010010000100 | 4 | 1001000000000 | 1 |
| 369 101110001 | 0001001010100 | 5 | 0100000010100 | 5 | 0101010000000 | 5 | 1010010000100 | 5 | 1001000000000 | 2 |
| 370 101110010 | 0001010000000 | 1 | 0100101010100 | 1 | 0100100000000 | 1 | 1001001000100 | 1 | 1001000000000 | 3 |
| 371 101110011 | 0001010000000 | 2 | 0100101010100 | 2 | 0100100000000 | 2 | 1001001000100 | 2 | 1001000000000 | 4 |
| 372 101110100 | 0001010000000 | 3 | 0100101010100 | 3 | 0100100000000 | 3 | 1001001000100 | 3 | 1001000000000 | 5 |
| 373 101110101 | 0001010000000 | 4 | 0100101010100 | 4 | 0100100000000 | 4 | 1001001000100 | 4 | 1000000000000 | 4 |
| 374 101110110 | 0001010000000 | 5 | 0100101010100 | 5 | 0100100000000 | 5 | 1001001000100 | 5 | 1010000000000 | 2 |
| 375 101110111 | 0001010000010 | 1 | 0001010010100 | 1 | 0010100000000 | 1 | 1000100100100 | 1 | 1010000000000 | 3 |
| 376 101111000 | 0001010000010 | 2 | 0001010010100 | 2 | 0010100000000 | 2 | 1000100100100 | 2 | 1010000000000 | 4 |
| 377 101111001 | 0001010000010 | 3 | 0001010010100 | 3 | 0010100000000 | 3 | 1000100100100 | 3 | 1010000000000 | 5 |
| 378 101111010 | 0001010000010 | 4 | 0001010010100 | 4 | 0010100000000 | 4 | 1000100100100 | 4 | 1001001001001 | 1 |
| 379 101111011 | 0001010000010 | 5 | 0001010010100 | 5 | 0010100000000 | 5 | 1000100100100 | 5 | 1001001001001 | 2 |
| 380 101111100 | 0000000000101 | 1 | 0001001010001 | 1 | 0100000000001 | 1 | 1000000000001 | 1 | 1001001001001 | 3 |
| 381 101111101 | 0000000000101 | 2 | 0001001010001 | 2 | 0100000000001 | 2 | 1000000000001 | 2 | 1001001010001 | 1 |
| 382 101111110 | 0000000000101 | 3 | 0001001010001 | 3 | 0100000000001 | 3 | 1000000000001 | 3 | 1001001010001 | 2 |
| 383 101111111 | 0000000001001 | 1 | 0001001010101 | 1 | 0100000000101 | 1 | 1000000000101 | 1 | 1001001010001 | 3 |

FIG. 4G

| Data bits | Channel bits | state | Channel bits | state | Channel bits | state | Channel bits | state | Channel bits | state |
|---|---|---|---|---|---|---|---|---|---|---|
| 384 110000000 | 0000000001001 | 2 | 0001001010101 | 2 | 0100000000101 | 2 | 1000000000101 | 2 | 1001001010101 | 1 |
| 385 110000001 | 0000000001001 | 3 | 0001001010101 | 3 | 0100000000101 | 3 | 1000000000101 | 3 | 1001001010101 | 2 |
| 386 110000010 | 0000000010001 | 1 | 0001010000001 | 1 | 0100000001001 | 1 | 1000000001001 | 1 | 1001001010101 | 3 |
| 387 110000011 | 0000000010001 | 2 | 0001010000001 | 2 | 0100000001001 | 2 | 1000000001001 | 2 | 1001010000001 | 1 |
| 388 110000100 | 0000000010001 | 3 | 0001010000001 | 3 | 0100000001001 | 3 | 1000000001001 | 3 | 1001010000001 | 2 |
| 389 110000101 | 0000000010101 | 1 | 0001010000101 | 1 | 0100000010001 | 1 | 1000000010001 | 1 | 1001010000001 | 3 |
| 390 110000110 | 0000000010101 | 2 | 0001010000101 | 2 | 0100000010001 | 2 | 1000000010001 | 2 | 1001010000101 | 1 |
| 391 110000111 | 0000000010101 | 3 | 0001010000101 | 3 | 0100000010001 | 3 | 1000000010001 | 3 | 1001010000101 | 2 |
| 392 110001000 | 0000000100001 | 1 | 0001010001001 | 1 | 0100000010101 | 1 | 1000000010101 | 1 | 1001010000101 | 3 |
| 393 110001001 | 0000000100001 | 2 | 0001010001001 | 2 | 0100000010101 | 2 | 1000000010101 | 2 | 1001010001001 | 1 |
| 394 110001010 | 0000000100001 | 3 | 0001010001001 | 3 | 0100000010101 | 3 | 1000000010101 | 3 | 1001010001001 | 2 |
| 395 110001011 | 0000000100101 | 1 | 0001010010001 | 1 | 0100000100001 | 1 | 1000000100001 | 1 | 1001010001001 | 3 |
| 396 110001100 | 0000000100101 | 2 | 0001010010001 | 2 | 0100000100001 | 2 | 1000000100001 | 2 | 1001010010001 | 1 |
| 397 110001101 | 0000000100101 | 3 | 0001010010001 | 3 | 0100000100001 | 3 | 1000000100001 | 3 | 1001010010001 | 2 |
| 398 110001110 | 0000000101001 | 1 | 0001010010101 | 1 | 0100000100101 | 1 | 1000000100101 | 1 | 1001010010001 | 3 |
| 399 110001111 | 0000000101001 | 2 | 0001010010101 | 2 | 0100000100101 | 2 | 1000000100101 | 2 | 1001010010101 | 1 |
| 400 110010000 | 0000000101001 | 3 | 0001010010101 | 3 | 0100000100101 | 3 | 1000000100101 | 3 | 1001010010101 | 2 |
| 401 110010001 | 0000001000001 | 1 | 0001010100001 | 1 | 0100000101001 | 1 | 1000000101001 | 1 | 1001010010101 | 3 |
| 402 110010010 | 0000001000001 | 2 | 0001010100001 | 2 | 0100000101001 | 2 | 1000000101001 | 2 | 1001010100001 | 1 |
| 403 110010011 | 0000001000001 | 3 | 0001010100001 | 3 | 0100000101001 | 3 | 1000000101001 | 3 | 1001010100001 | 2 |
| 404 110010100 | 0000001000101 | 1 | 0001010100101 | 1 | 0100001000001 | 1 | 1000001000001 | 1 | 1001010100001 | 3 |
| 405 110010101 | 0000001000101 | 2 | 0001010100101 | 2 | 0100001000001 | 2 | 1000001000001 | 2 | 1001010100101 | 1 |
| 406 110010110 | 0000001000101 | 3 | 0001010100101 | 3 | 0100001000001 | 3 | 1000001000001 | 3 | 1001010100101 | 2 |
| 407 110010111 | 0000001001001 | 1 | 0001010101001 | 1 | 0100001000101 | 1 | 1000001000101 | 1 | 1001010100101 | 3 |
| 408 110011000 | 0000001001001 | 2 | 0001010101001 | 2 | 0100001000101 | 2 | 1000001000101 | 2 | 1001010101001 | 1 |
| 409 110011001 | 0000001001001 | 3 | 0001010101001 | 3 | 0100001000101 | 3 | 1000001000101 | 3 | 1001010101001 | 2 |
| 410 110011010 | 0000001010001 | 1 | 0010000000001 | 1 | 0100001001001 | 1 | 1000001001001 | 1 | 1001010101001 | 3 |
| 411 110011011 | 0000001010001 | 2 | 0010000000001 | 2 | 0100001001001 | 2 | 1000001001001 | 2 | 1010000000001 | 1 |
| 412 110011100 | 0000001010001 | 3 | 0010000000001 | 3 | 0100001001001 | 3 | 1000001001001 | 3 | 1010000000001 | 2 |
| 413 110011101 | 0000001010101 | 1 | 0010000000101 | 1 | 0100001010001 | 1 | 1000001010001 | 1 | 1010000000001 | 3 |
| 414 110011110 | 0000001010101 | 2 | 0010000000101 | 2 | 0100001010001 | 2 | 1000001010001 | 2 | 1010000000101 | 1 |
| 415 110011111 | 0000001010101 | 3 | 0010000000101 | 3 | 0100001010001 | 3 | 1000001010001 | 3 | 1010000000101 | 2 |
| 416 110100000 | 0000010000001 | 1 | 0010000001001 | 1 | 0100001010101 | 1 | 1000001010101 | 1 | 1010000000101 | 3 |
| 417 110100001 | 0000010000001 | 2 | 0010000001001 | 2 | 0100001010101 | 2 | 1000001010101 | 2 | 1010000001001 | 1 |
| 418 110100010 | 0000010000001 | 3 | 0010000001001 | 3 | 0100001010101 | 3 | 1000001010101 | 3 | 1010000001001 | 2 |
| 419 110100011 | 0000010000101 | 1 | 0010000010001 | 1 | 0100010000001 | 1 | 1000010000001 | 1 | 1010000001001 | 3 |
| 420 110100100 | 0000010000101 | 2 | 0010000010001 | 2 | 0100010000001 | 2 | 1000010000001 | 2 | 1010000010001 | 1 |
| 421 110100101 | 0000010000101 | 3 | 0010000010001 | 3 | 0100010000001 | 3 | 1000010000001 | 3 | 1010000010001 | 2 |
| 422 110100110 | 0000010001001 | 1 | 0010000010101 | 1 | 0100010000101 | 1 | 1000010000101 | 1 | 1010000010001 | 3 |
| 423 110100111 | 0000010001001 | 2 | 0010000010101 | 2 | 0100010000101 | 2 | 1000010000101 | 2 | 1010000010101 | 1 |
| 424 110101000 | 0000010001001 | 3 | 0010000010101 | 3 | 0100010000101 | 3 | 1000010000101 | 3 | 1010000010101 | 2 |
| 425 110101001 | 0000010010001 | 1 | 0010000100001 | 1 | 0100010001001 | 1 | 1000010001001 | 1 | 1010000010101 | 3 |
| 426 110101010 | 0000010010001 | 2 | 0010000100001 | 2 | 0100010001001 | 2 | 1000010001001 | 2 | 1010000100001 | 1 |
| 427 110101011 | 0000010010001 | 3 | 0010000100001 | 3 | 0100010001001 | 3 | 1000010001001 | 3 | 1010000100001 | 2 |
| 428 110101100 | 0000010010101 | 1 | 0010000100101 | 1 | 0100010010001 | 1 | 1000010010001 | 1 | 1010000100001 | 3 |
| 429 110101101 | 0000010010101 | 2 | 0010000100101 | 2 | 0100010010001 | 2 | 1000010010001 | 2 | 1010000100101 | 1 |
| 430 110101110 | 0000010010101 | 3 | 0010000100101 | 3 | 0100010010001 | 3 | 1000010010001 | 3 | 1010000100101 | 2 |
| 431 110101111 | 0000010100001 | 1 | 0010000101001 | 1 | 0100010010101 | 1 | 1000010010101 | 1 | 1010000100101 | 3 |
| 432 110110000 | 0000010100001 | 2 | 0010000101001 | 2 | 0100010010101 | 2 | 1000010010101 | 2 | 1010000101001 | 1 |
| 433 110110001 | 0000010100001 | 3 | 0010000101001 | 3 | 0100010010101 | 3 | 1000010010101 | 3 | 1010000101001 | 2 |
| 434 110110010 | 0000010100101 | 1 | 0010001000001 | 1 | 0100010100001 | 1 | 1000010100001 | 1 | 1010000101001 | 3 |
| 435 110110011 | 0000010100101 | 2 | 0010001000001 | 2 | 0100010100001 | 2 | 1000010100001 | 2 | 1010001000001 | 1 |
| 436 110110100 | 0000010100101 | 3 | 0010001000001 | 3 | 0100010100001 | 3 | 1000010100001 | 3 | 1010001000001 | 2 |
| 437 110110101 | 0000010101001 | 1 | 0010001000101 | 1 | 0100010100101 | 1 | 1000010100101 | 1 | 1010001000001 | 3 |
| 438 110110110 | 0000010101001 | 2 | 0010001000101 | 2 | 0100010100101 | 2 | 1000010100101 | 2 | 1010001000101 | 1 |
| 439 110110111 | 0000010101001 | 3 | 0010001000101 | 3 | 0100010100101 | 3 | 1000010100101 | 3 | 1010001000101 | 2 |
| 440 110111000 | 0000100000001 | 1 | 0010001001001 | 1 | 0100010101001 | 1 | 1000010101001 | 1 | 1010001000101 | 3 |
| 441 110111001 | 0000100000001 | 2 | 0010001001001 | 2 | 0100010101001 | 2 | 1000010101001 | 2 | 1010001001001 | 1 |
| 442 110111010 | 0000100000001 | 3 | 0010001001001 | 3 | 0100010101001 | 3 | 1000010101001 | 3 | 1010001001001 | 2 |
| 443 110111011 | 0000100000101 | 1 | 0010001010001 | 1 | 0100100000001 | 1 | 1000100000001 | 1 | 1010001001001 | 3 |
| 444 110111100 | 0000100000101 | 2 | 0010001010001 | 2 | 0100100000001 | 2 | 1000100000001 | 2 | 1010001010001 | 1 |
| 445 110111101 | 0000100000101 | 3 | 0010001010001 | 3 | 0100100000001 | 3 | 1000100000001 | 3 | 1010001010001 | 2 |
| 446 110111110 | 0000100001001 | 1 | 0010001010101 | 1 | 0100100000101 | 1 | 1000100000101 | 1 | 1010001010001 | 3 |
| 447 110111111 | 0000100001001 | 2 | 0010001010101 | 2 | 0100100000101 | 2 | 1000100000101 | 2 | 1010001010101 | 1 |

FIG. 4H

| Data bits | Channel bits | state | Channel bits | state | Channel bits | state | Channel bits | state | Channel bits | state |
|---|---|---|---|---|---|---|---|---|---|---|
| 448 111000000 | 0000100001001 | 3 | 0010001010101 | 3 | 0100100000101 | 3 | 1000100000101 | 3 | 1010001010101 | 2 |
| 449 111000001 | 0000100010001 | 1 | 0010010000001 | 1 | 0100100001001 | 1 | 1000100001001 | 1 | 1010001010101 | 3 |
| 450 111000010 | 0000100010001 | 2 | 0010010000001 | 2 | 0100100001001 | 2 | 1000100001001 | 2 | 1010010000001 | 1 |
| 451 111000011 | 0000100010001 | 3 | 0010010000001 | 3 | 0100100001001 | 3 | 1000100001001 | 3 | 1010010000001 | 2 |
| 452 111000100 | 0000100010101 | 1 | 0010010000101 | 1 | 0100100010001 | 1 | 1000100010001 | 1 | 1010010000001 | 3 |
| 453 111000101 | 0000100010101 | 2 | 0010010000101 | 2 | 0100100010001 | 2 | 1000100010001 | 2 | 1010010000101 | 1 |
| 454 111000110 | 0000100010101 | 3 | 0010010000101 | 3 | 0100100010001 | 3 | 1000100010001 | 3 | 1010010000101 | 2 |
| 455 111000111 | 0000100100001 | 1 | 0010010001001 | 1 | 0100100010101 | 1 | 1000100010101 | 1 | 1010010000101 | 3 |
| 456 111001000 | 0000100100001 | 2 | 0010010001001 | 2 | 0100100010101 | 2 | 1000100010101 | 2 | 1010010001001 | 1 |
| 457 111001001 | 0000100100001 | 3 | 0010010001001 | 3 | 0100100010101 | 3 | 1000100010101 | 3 | 1010010001001 | 2 |
| 458 111001010 | 0000100100101 | 1 | 0010010010001 | 1 | 0100100100001 | 1 | 1000100100001 | 1 | 1010010001001 | 3 |
| 459 111001011 | 0000100100101 | 2 | 0010010010001 | 2 | 0100100100001 | 2 | 1000100100001 | 2 | 1010010010001 | 1 |
| 460 111001100 | 0000100100101 | 3 | 0010010010001 | 3 | 0100100100001 | 3 | 1000100100001 | 3 | 1010010010001 | 2 |
| 461 111001101 | 0000100101001 | 1 | 0010010010101 | 1 | 0100100100101 | 1 | 1000100100101 | 1 | 1010010010001 | 3 |
| 462 111001110 | 0000100101001 | 2 | 0010010010101 | 2 | 0100100100101 | 2 | 1000100100101 | 2 | 1010010010101 | 1 |
| 463 111001111 | 0000100101001 | 3 | 0010010010101 | 3 | 0100100100101 | 3 | 1000100100101 | 3 | 1010010010101 | 2 |
| 464 111010000 | 0000101000001 | 1 | 0010010100001 | 1 | 0100100101001 | 1 | 1000100101001 | 1 | 1010010010101 | 3 |
| 465 111010001 | 0000101000001 | 2 | 0010010100001 | 2 | 0100100101001 | 2 | 1000100101001 | 2 | 1010010100001 | 1 |
| 466 111010010 | 0000101000001 | 3 | 0010010100001 | 3 | 0100100101001 | 3 | 1000100101001 | 3 | 1010010100001 | 2 |
| 467 111010011 | 0000101000101 | 1 | 0010010100101 | 1 | 0100101000001 | 1 | 1000101000001 | 1 | 1010010100001 | 3 |
| 468 111010100 | 0000101000101 | 2 | 0010010100101 | 2 | 0100101000001 | 2 | 1000101000001 | 2 | 1010010100101 | 1 |
| 469 111010101 | 0000101000101 | 3 | 0010010100101 | 3 | 0100101000001 | 3 | 1000101000001 | 3 | 1010010100101 | 2 |
| 470 111010110 | 0000101001001 | 1 | 0010010101001 | 1 | 0100101000101 | 1 | 1000101000101 | 1 | 1010010100101 | 3 |
| 471 111010111 | 0000101001001 | 2 | 0010010101001 | 2 | 0100101000101 | 2 | 1000101000101 | 2 | 1010010101001 | 1 |
| 472 111011000 | 0000101001001 | 3 | 0010010101001 | 3 | 0100101000101 | 3 | 1000101000101 | 3 | 1010010101001 | 2 |
| 473 111011001 | 0000101010001 | 1 | 0010100000001 | 1 | 0100101001001 | 1 | 1000101001001 | 1 | 1010010101001 | 3 |
| 474 111011010 | 0000101010001 | 2 | 0010100000001 | 2 | 0100101001001 | 2 | 1000101001001 | 2 | 1010100000001 | 1 |
| 475 111011011 | 0000101010001 | 3 | 0010100000001 | 3 | 0100101001001 | 3 | 1000101001001 | 3 | 1010100000001 | 2 |
| 476 111011100 | 0000101010101 | 1 | 0010100000101 | 1 | 0100101010001 | 1 | 1000101010001 | 1 | 1010100000001 | 3 |
| 477 111011101 | 0000101010101 | 2 | 0010100000101 | 2 | 0100101010001 | 2 | 1000101010001 | 2 | 1010100000101 | 1 |
| 478 111011110 | 0000101010101 | 3 | 0010100000101 | 3 | 0100101010001 | 3 | 1000101010001 | 3 | 1010100000101 | 2 |
| 479 111011111 | 0001000000001 | 1 | 0010100001001 | 1 | 0100101010101 | 1 | 1000101010101 | 1 | 1010100000101 | 3 |
| 480 111100000 | 0001000000001 | 2 | 0010100001001 | 2 | 0100101010101 | 2 | 1000101010101 | 2 | 1010100001001 | 1 |
| 481 111100001 | 0001000000001 | 3 | 0010100001001 | 3 | 0100101010101 | 3 | 1000101010101 | 3 | 1010100001001 | 2 |
| 482 111100010 | 0001000000101 | 1 | 0010100010001 | 1 | 0101000000001 | 1 | 1001000000001 | 1 | 1010100001001 | 3 |
| 483 111100011 | 0001000000101 | 2 | 0010100010001 | 2 | 0101000000001 | 2 | 1001000000001 | 2 | 1010100010001 | 1 |
| 484 111100100 | 0001000000101 | 3 | 0010100010001 | 3 | 0101000000001 | 3 | 1001000000001 | 3 | 1010100010001 | 2 |
| 485 111100101 | 0001000001001 | 1 | 0010100010101 | 1 | 0101000000101 | 1 | 1001000000101 | 1 | 1010100010001 | 3 |
| 486 111100110 | 0001000001001 | 2 | 0010100010101 | 2 | 0101000000101 | 2 | 1001000000101 | 2 | 1010100010101 | 1 |
| 487 111100111 | 0001000001001 | 3 | 0010100010101 | 3 | 0101000000101 | 3 | 1001000000101 | 3 | 1010100010101 | 2 |
| 488 111101000 | 0001000010001 | 1 | 0010100100001 | 1 | 0101000001001 | 1 | 1001000001001 | 1 | 1010100010101 | 3 |
| 489 111101001 | 0001000010001 | 2 | 0010100100001 | 2 | 0101000001001 | 2 | 1001000001001 | 2 | 1010100100001 | 1 |
| 490 111101010 | 0001000010001 | 3 | 0010100100001 | 3 | 0101000001001 | 3 | 1001000001001 | 3 | 1010100100001 | 2 |
| 491 111101011 | 0001000010101 | 1 | 0010100100101 | 1 | 0101000010001 | 1 | 1001000010001 | 1 | 1010100100001 | 3 |
| 492 111101100 | 0001000010101 | 2 | 0010100100101 | 2 | 0101000010001 | 2 | 1001000010001 | 2 | 1010100100101 | 1 |
| 493 111101101 | 0001000010101 | 3 | 0010100100101 | 3 | 0101000010001 | 3 | 1001000010001 | 3 | 1010100100101 | 2 |
| 494 111101110 | 0001000100001 | 1 | 0010100101001 | 1 | 0101000010101 | 1 | 1001000010101 | 1 | 1010100100101 | 3 |
| 495 111101111 | 0001000100001 | 2 | 0010100101001 | 2 | 0101000010101 | 2 | 1001000010101 | 2 | 1010100101001 | 1 |
| 496 111110000 | 0001000100001 | 3 | 0010100101001 | 3 | 0101000010101 | 3 | 1001000010101 | 3 | 1010100101001 | 2 |
| 497 111110001 | 0001000100101 | 1 | 0010101000001 | 1 | 0101000100001 | 1 | 1001000100001 | 1 | 1010100101001 | 3 |
| 498 111110010 | 0001000100101 | 2 | 0010101000001 | 2 | 0101000100001 | 2 | 1001000100001 | 2 | 1010101000001 | 1 |
| 499 111110011 | 0001000100101 | 3 | 0010101000001 | 3 | 0101000100001 | 3 | 1001000100001 | 3 | 1010101000001 | 2 |
| 500 111110100 | 0001000101001 | 1 | 0010101000101 | 1 | 0101000100101 | 1 | 1001000100101 | 1 | 1010101000001 | 3 |
| 501 111110101 | 0001000101001 | 2 | 0010101000101 | 2 | 0101000100101 | 2 | 1001000100101 | 2 | 1010101000101 | 1 |
| 502 111110110 | 0001000101001 | 3 | 0010101000101 | 3 | 0101000100101 | 3 | 1001000100101 | 3 | 1010101000101 | 2 |
| 503 111110111 | 0001001000001 | 1 | 0010101001001 | 1 | 0101000101001 | 1 | 1001000101001 | 1 | 1010101000101 | 3 |
| 504 111111000 | 0001001000001 | 2 | 0010101001001 | 2 | 0101000101001 | 2 | 1001000101001 | 2 | 1010101001001 | 1 |
| 505 111111001 | 0001001000001 | 3 | 0010101001001 | 3 | 0101000101001 | 3 | 1001000101001 | 3 | 1010101001001 | 2 |
| 506 111111010 | 0001001000101 | 1 | 0010101010001 | 1 | 0101001000001 | 1 | 1001001000001 | 1 | 1010101001001 | 3 |
| 507 111111011 | 0001001000101 | 2 | 0010101010001 | 2 | 0101001000001 | 2 | 1001001000001 | 2 | 1010101010001 | 1 |
| 508 111111100 | 0001001000101 | 3 | 0010101010001 | 3 | 0101001000001 | 3 | 1001001000001 | 3 | 1010101010001 | 2 |
| 509 111111101 | 0001001001001 | 1 | 0010101010101 | 1 | 0101001000101 | 1 | 1001001000101 | 1 | 1010101010001 | 3 |
| 510 111111110 | 0001001001001 | 2 | 0010101010101 | 2 | 0101001000101 | 2 | 1001001000101 | 2 | 1010101010101 | 1 |
| 511 111111111 | 0001001001001 | 3 | 0010101010101 | 3 | 0101001000101 | 3 | 1001001000101 | 3 | 1010101010101 | 2 |

| INFORMATION WORDS (DECIMAL NOTATION) | STATE | CODE WORDS | NEXT STATE |
|---|---|---|---|
| 000000001 (1) | S1 | 0000000000100 | S2 |
| 000000011 (3) | S2 | 0001010001010 | S4 |
| 000000101 (5) | S4 | 0101001001001 | S1 |
| 000001100 (12) | S1 | 0000000001010 | S3 |
| 000010011 (19) | S3 | 0101000010100 | S5 |

FIG. 12

| SUBGROUP | STATE 1 | STATE 2 | STATE 3 | STATE 4 | STATE 5 | STATE 6 | STATE 7 | STATE 8 | STATE 9 | STATE 10 | STATE 11 | STATE 12 | STATE 13 |
|---|---|---|---|---|---|---|---|---|---|---|---|---|---|
| E00 | 24 | 32 | 32 | 32 | 32 | 24 | 32 | 20 | 0 | 0 | 0 | 0 | 0 |
| E01 | 25 | 12 | 12 | 12 | 12 | 25 | 12 | 33 | 0 | 0 | 0 | 0 | 0 |
| E10 | 0 | 0 | 0 | 0 | 0 | 0 | 0 | 0 | 24 | 24 | 24 | 32 | 39 |
| E11 | 0 | 0 | 0 | 0 | 0 | 0 | 0 | 0 | 25 | 25 | 25 | 12 | 2 |

1st KIND: States 1–8  
2nd KIND: States 9–13

| Data | Channel bits | state | Channel bits | state | Channel bits | state | Channel bits | state | Channel bits | state | Channel bits | state | Channel bits | state |
|---|---|---|---|---|---|---|---|---|---|---|---|---|---|---|
| 291 000000001101 | 3 000101001010 | 6 010001000010 | 6 010101010100 | 6 001010000000 | 6 001010001000 | 6 100100000000 | 6 101001010100 | 6 100100010100 | 6 100100010100 | 6 100100010000 | 6 101000010000 | 6 100100010000 | 6 |
| 292 000000001101 | 4 000101001010 | 7 010010000010 | 7 010010100010 | 7 001010001000 | 7 001000001000 | 7 100100001000 | 7 101001001010 | 7 101001001010 | 7 101001010010 | 7 101000010000 | 7 101000010000 | 7 |
| 293 000000001101 | 5 000101001010 | 8 010001001010 | 8 010000101010 | 8 001010010100 | 8 001000010000 | 8 100100010000 | 8 101001001010 | 8 101001001010 | 8 101000001000 | 8 100100010000 | 8 100100010000 | 8 |
| 294 000000001101 | 6 000101001010 | 9 010001001010 | 9 010010101010 | 9 001001001000 | 9 001000001000 | 9 100100001000 | 9 101001001010 | 9 101000100100 | 9 102001001000 | 9 100100010000 | 9 100100010000 | 9 |
| 295 000000001101 | 7 000101001001010 | 10 010001001010 | 10 010001010100 | 10 001001010100 | 10 001001010000 | 10 100100010000 | 10 101001010010 | 10 101000100010 | 10 100100010010 | 10 100100010000 | 10 |
| 296 000000001101 | 8 000101001010 | 11 010001010010 | 11 010001010100 | 11 001001010010 | 11 001001000000 | 11 100100010101 | 11 101001010100 | 11 101001010100 | 11 101001010000 | 11 |
| 297 000000001101 | 0 000101001010 | 12 010001000010 | 12 010001010010 | 12 001001010010 | 12 001001010000 | 12 100100010100 | 12 101001010100 | 12 101001010100 | 12 100101010000 | 12 |
| 298 000000001101 | 1 000101001010 | 13 010001010010 | 13 010001010010 | 13 001001010010 | 13 001001010010 | 13 101001010010 | 13 101001010010 | 13 101001010010 | 13 |
| 299 000000001001 | 2 000101001010 | 1 010010100100 | 1 001001000100 | 1 001001001010 | 1 001000010000 | 1 100101000100 | 1 101001010000 | 1 |
| 300 000000100001 | 3 000101001010 | 2 010010010010 | 2 010010010010 | 2 010100010100 | 2 010100010010 | 2 101001010010 | 2 101001010010 | 2 |
| 301 000000001001 | 4 000101010000 | 3 010001010010 | 3 010001000010 | 3 001001010010 | 3 001001010010 | 3 101001010010 | 3 101001010010 | 3 |
| 302 000000001001 | 5 000100100010 | 4 010001001010 | 4 010010010010 | 4 010100010010 | 4 010100001010 | 4 101010001010 | 4 101001001010 | 4 |
| 303 000000001001 | 6 000101001010 | 5 010010001010 | 5 010001001010 | 5 001001001010 | 5 001010001010 | 5 101010010010 | 5 101001010010 | 5 |
| 304 000000001001 | 7 000101001010 | 6 010010010010 | 6 010010001010 | 6 010010001010 | 6 010010010010 | 6 101001001010 | 6 101001010010 | 6 |
| 305 000000001001 | 1 000101001010 | 7 010010010010 | 7 010010010010 | 7 010100010010 | 7 010100010010 | 7 101010010010 | 7 101001010010 | 7 |
| 306 000000001001 | 2 000101010100 | 8 010001010010 | 8 010010001010 | 8 001010001010 | 8 010010001010 | 8 101000100010 | 8 101001010010 | 8 |
| 307 000000100001 | 3 000101001010 | 9 010010100010 | 9 010100100100 | 9 001010010100 | 9 010100010010 | 9 101001001010 | 9 101000101000 | 9 |
| 308 000000001001 | 4 000101010000 | 10 010010101010 | 10 010100101010 | 10 001010001010 | 10 010100010010 | 10 101001010010 | 10 101001010010 | 10 |
| 309 000000010001 | 5 000101010010 | 11 010010100010 | 11 010010010010 | 11 001001001010 | 11 001001001010 | 11 101001001010 | 11 101001001010 | 11 |
| 310 000000100010 | 6 000101010100 | 12 010100101010 | 12 010100101010 | 12 001010001010 | 12 001010001010 | 12 101010010010 | 12 101010010010 | 12 |
| 311 000000001010 | 7 000101010010 | 13 010010010010 | 13 010010010010 | 13 001010010010 | 13 001010010010 | 13 101010010010 | 13 101010010010 | 13 |
| 312 000000100101 | 8 000101010010 | 1 010001010010 | 1 010001000100 | 1 010010010100 | 1 010010010000 | 1 100101010000 | 1 100101000000 | 1 |

| SUBGROUP | STATE 1 | STATE 2 | STATE 3 | STATE 4 | STATE 5 | STATE 6 | STATE 7 | STATE 8 | STATE 9 | STATE 10 | STATE 11 | STATE 12 | STATE 13 |
|---|---|---|---|---|---|---|---|---|---|---|---|---|---|
| E00 | 114 | 114 | 114 | 114 | 113 | 113 | 114 | 114 | 0 | 0 | 0 | 0 | 0 |
| E01 | 71 | 71 | 71 | 71 | 72 | 72 | 71 | 71 | 0 | 0 | 0 | 0 | 0 |
| E10 | 0 | 0 | 0 | 0 | 0 | 0 | 0 | 0 | 112 | 113 | 112 | 112 | 112 |
| E11 | 0 | 0 | 0 | 0 | 0 | 0 | 0 | 0 | 75 | 74 | 75 | 75 | 75 |

1st KIND: states 1–8
2nd KIND: states 9–13

| SUBGROUP | 1st KIND | | | 2nd KIND | |
| --- | --- | --- | --- | --- | --- |
| | STATE 1 | STATE 2 | STATE 3 | STATE 4 | STATE 5 |
| E00 | 1176 | 1176 | 1176 | 0 | 0 |
| E01 | 771 | 771 | 771 | 0 | 0 |
| E10 | 0 | 0 | 0 | 1169 | 1169 |
| E11 | 0 | 0 | 0 | 782 | 782 |

FIG. 17A

Rate 13/19, d=1, k=10, 5 states

| Data bits | | State 1 Channel bits | state | State 2 Channel bits | state | State 3 Channel bits | state | State 4 Channel bits | state |
|---|---|---|---|---|---|---|---|---|---|
| 0 | 0000001000000000100 | 0010000000101001001 | 1 | 0100001010000101001 | 1 | 1000000000010000001 | 1 | 1001001001010010000 | 1 |
| 1 | 0000001000000000100 | 0010000000101001001 | 2 | 0100001010000101001 | 2 | 1000000000010000001 | 2 | 1001001001010010000 | 2 |
| 2 | 0000001000000000100 | 0010000000101001001 | 3 | 0100001010000101001 | 3 | 1000000000010000001 | 3 | 1001001001010010000 | 3 |
| 3 | 0000001000000000100 | 0010000000101001010 | 1 | 0100001010000101010 | 1 | 1000000000010000010 | 1 | 1001001001010010000 | 4 |
| 4 | 0000001000000000100 | 0010000000101001010 | 2 | 0100001010000101010 | 2 | 1000000000010000010 | 2 | 1001001001010010000 | 5 |
| 5 | 0000001000000000101 | 0010000000101001010 | 3 | 0100001010000101010 | 3 | 1000000000010000010 | 3 | 1001001001010010001 | 1 |
| 6 | 0000001000000000101 | 0010000000101001010 | 4 | 0100001010000101010 | 4 | 1000000000010000010 | 4 | 1001001001010010001 | 2 |
| 7 | 0000001000000000101 | 0010000000101001010 | 5 | 0100001010000101010 | 5 | 1000000000010000010 | 5 | 1001001001010010001 | 3 |
| 8 | 0000001000000001000 | 0010000000101010000 | 1 | 0100001010001000001 | 1 | 1000000000010000100 | 1 | 1001001001010010010 | 1 |
| 9 | 0000001000000001000 | 0010000000101010000 | 2 | 0100001010001000001 | 2 | 1000000000010000100 | 2 | 1001001001010010010 | 2 |
| 10 | 0000001000000001000 | 0010000000101010000 | 3 | 0100001010001000001 | 3 | 1000000000010000100 | 3 | 1001001001010010010 | 3 |
| 11 | 0000001000000001000 | 0010000000101010000 | 4 | 0100001010001000010 | 1 | 1000000000010000100 | 4 | 1001001001010010010 | 4 |
| 12 | 0000001000000001000 | 0010000000101010000 | 5 | 0100001010001000010 | 2 | 1000000000010000100 | 5 | 1001001001010010010 | 5 |
| 13 | 0000001000000001001 | 0010000000101010001 | 1 | 0100001010001000010 | 3 | 1000000000010000101 | 1 | 1001001001010010100 | 1 |
| 14 | 0000001000000001001 | 0010000000101010001 | 2 | 0100001010001000010 | 4 | 1000000000010000101 | 2 | 1001001001010010100 | 2 |
| 15 | 0000001000000001001 | 0010000000101010001 | 3 | 0100001010001000010 | 5 | 1000000000010000101 | 3 | 1001001001010010100 | 3 |
| 16 | 0000001000000001010 | 0010000000101010010 | 1 | 0100001010001000100 | 1 | 1000000000010001000 | 1 | 1001001001010010100 | 4 |
| 17 | 0000001000000001010 | 0010000000101010010 | 2 | 0100001010001000100 | 2 | 1000000000010001000 | 2 | 1001001001010010100 | 5 |
| 18 | 0000001000000001010 | 0010000000101010010 | 3 | 0100001010001000100 | 3 | 1000000000010001000 | 3 | 1001001001010010101 | 1 |
| 19 | 0000001000000001010 | 0010000000101010010 | 4 | 0100001010001000100 | 4 | 1000000000010001000 | 4 | 1001001001010010101 | 2 |
| 20 | 0000001000000001010 | 0010000000101010010 | 5 | 0100001010001000100 | 5 | 1000000000010001000 | 5 | 1001001001010010101 | 3 |
| 21 | 0000001000000010000 | 0010000000101010100 | 1 | 0100001010001000101 | 1 | 1000000000010001001 | 1 | 1001001001010100000 | 1 |
| 22 | 0000001000000010000 | 0010000000101010100 | 2 | 0100001010001000101 | 2 | 1000000000010001001 | 2 | 1001001001010100000 | 2 |
| 23 | 0000001000000010000 | 0010000000101010100 | 3 | 0100001010001000101 | 3 | 1000000000010001001 | 3 | 1001001001010100000 | 3 |
| 24 | 0000001000000010000 | 0010000000101010100 | 4 | 0100001010001001000 | 1 | 1000000000010001010 | 1 | 1001001001010100000 | 4 |
| 25 | 0000001000000010000 | 0010000000101010100 | 5 | 0100001010001001000 | 2 | 1000000000010001010 | 2 | 1001001001010100000 | 5 |
| 26 | 0000001000000010001 | 0010000000101010101 | 1 | 0100001010001001000 | 3 | 1000000000010001010 | 3 | 1001001001010100001 | 1 |
| 27 | 0000001000000010001 | 0010000000101010101 | 2 | 0100001010001001000 | 4 | 1000000000010001010 | 4 | 1001001001010100001 | 2 |
| 28 | 0000001000000010001 | 0010000000101010101 | 3 | 0100001010001001000 | 5 | 1000000000010001010 | 5 | 1001001001010100001 | 3 |
| 29 | 0000001000000010010 | 0010000001000000001 | 1 | 0100001010001001001 | 1 | 1000000000010010000 | 1 | 1001001001010100010 | 1 |
| 30 | 0000001000000010010 | 0010000001000000001 | 2 | 0100001010001001001 | 2 | 1000000000010010000 | 2 | 1001001001010100010 | 2 |
| 31 | 0000001000000010010 | 0010000001000000001 | 3 | 0100001010001001001 | 3 | 1000000000010010000 | 3 | 1001001001010100010 | 3 |
| 32 | 0000001000000010010 | 0010000001000000010 | 4 | 0100001010001001010 | 1 | 1000000000010010000 | 4 | 1001001001010100010 | 4 |
| 33 | 0000001000000010010 | 0010000001000000010 | 5 | 0100001010001001010 | 2 | 1000000000010010000 | 5 | 1001001001010100010 | 5 |
| 34 | 0000001000000010100 | 0010000001000000010 | 1 | 0100001010001001010 | 3 | 1000000000010010001 | 3 | 1001001001010100100 | 1 |
| 35 | 0000001000000010100 | 0010000001000000010 | 2 | 0100001010001001010 | 4 | 1000000000010010001 | 4 | 1001001001010100100 | 2 |
| 36 | 0000001000000010100 | 0010000001000000010 | 3 | 0100001010001001010 | 5 | 1000000000010010001 | 5 | 1001001001010100100 | 3 |
| 37 | 0000001000000010100 | 0010000001000000100 | 4 | 0100001010001010000 | 1 | 1000000000010010010 | 1 | 1001001001010100100 | 4 |
| 38 | 0000001000000010100 | 0010000001000000100 | 5 | 0100001010001010000 | 2 | 1000000000010010010 | 2 | 1001001001010100100 | 5 |
| 39 | 0000001000000010101 | 0010000001000000100 | 1 | 0100001010001010000 | 3 | 1000000000010010010 | 3 | 1001001001010100101 | 1 |
| 40 | 0000001000000010101 | 0010000001000000100 | 2 | 0100001010001010000 | 4 | 1000000000010010010 | 4 | 1001001001010100101 | 2 |
| 41 | 0000001000000010101 | 0010000001000000100 | 3 | 0100001010001010000 | 5 | 1000000000010010010 | 5 | 1001001001010100101 | 3 |
| 42 | 0000001000000100000 | 0010000001000000101 | 1 | 0100001010001010001 | 1 | 1000000000010010100 | 1 | 1001001001010101000 | 1 |
| 43 | 0000001000000100000 | 0010000001000000101 | 2 | 0100001010001010001 | 2 | 1000000000010010100 | 2 | 1001001001010101000 | 2 |
| 44 | 0000001000000100000 | 0010000001000000101 | 3 | 0100001010001010001 | 3 | 1000000000010010100 | 3 | 1001001001010101000 | 3 |
| 45 | 0000001000000100000 | 0010000001000001000 | 4 | 0100001010001010010 | 1 | 1000000000010010100 | 4 | 1001001001010101000 | 4 |

FIG. 17B

| | Data bits | state | Channel bits | state | Channel bits | state | Channel bits | state | Channel bits | state |
|---|---|---|---|---|---|---|---|---|---|---|
| 1565 | 0000100000001000101 | 1 | 0010001001000010101 | 1 | 0100010101000001001 | 3 | 1000001000010101001 | 1 | 1001010100100001010 | 3 |
| 1566 | 0000100000001000101 | 2 | 0010001001000010101 | 2 | 0100010101000001010 | 1 | 1000001000010101001 | 2 | 1001010100100001010 | 4 |
| 1567 | 0000100000001000101 | 3 | 0010001001000010101 | 3 | 0100010101000001010 | 2 | 1000001000010101001 | 3 | 1001010100100001010 | 5 |
| 1568 | 0000100000001001000 | 1 | 0010001001000100000 | 1 | 0100010101000001010 | 3 | 1000001000010101010 | 1 | 1001010100100010000 | 1 |
| 1569 | 0000100000001001000 | 2 | 0010001001000100000 | 2 | 0100010101000001010 | 4 | 1000001000010101010 | 2 | 1001010100100010000 | 2 |
| 1570 | 0000100000001001000 | 3 | 0010001001000100000 | 3 | 0100010101000001010 | 5 | 1000001000010101010 | 3 | 1001010100100010000 | 3 |
| 1571 | 0000100000001001000 | 4 | 0010001001000100000 | 4 | 0100010101000010000 | 1 | 1000001000010101010 | 4 | 1001010100100010000 | 4 |
| 1572 | 0000100000001001000 | 5 | 0010001001000100000 | 5 | 0100010101000010000 | 2 | 1000001000010101010 | 5 | 1001010100100010000 | 5 |
| 1573 | 0000100000001001001 | 1 | 0010001001000100001 | 1 | 0100010101000010000 | 3 | 1000001000100000001 | 1 | 1001010100100010001 | 1 |
| 1574 | 0000100000001001001 | 2 | 0010001001000100001 | 2 | 0100010101000010000 | 4 | 1000001000100000001 | 2 | 1001010100100010001 | 2 |
| 1575 | 0000100000001001001 | 3 | 0010001001000100001 | 3 | 0100010101000010000 | 5 | 1000001000100000001 | 3 | 1001010100100010001 | 3 |
| 1576 | 0000100000001001010 | 1 | 0010001001000100010 | 1 | 0100010101000010001 | 1 | 1000001000100000010 | 1 | 1001010100100010010 | 1 |
| 1577 | 0000100000001001010 | 2 | 0010001001000100010 | 2 | 0100010101000010001 | 2 | 1000001000100000010 | 2 | 1001010100100010010 | 2 |
| 1578 | 0000100000001001010 | 3 | 0010001001000100010 | 3 | 0100010101000010001 | 3 | 1000001000100000010 | 3 | 1001010100100010010 | 3 |
| 1579 | 0000100000001001010 | 4 | 0010001001000100010 | 4 | 0100010101000010010 | 1 | 1000001000100000010 | 4 | 1001010100100010010 | 4 |
| 1580 | 0000100000001001010 | 5 | 0010001001000100010 | 5 | 0100010101000010010 | 2 | 1000001000100000010 | 5 | 1001010100100010010 | 5 |
| 1581 | 0000100000001010000 | 1 | 0010001001000100100 | 1 | 0100010101000010010 | 3 | 1000001000100000100 | 1 | 1001010100100010100 | 1 |
| 1582 | 0000100000001010000 | 2 | 0010001001000100100 | 2 | 0100010101000010010 | 4 | 1000001000100000100 | 2 | 1001010100100010100 | 2 |
| 1583 | 0000100000001010000 | 3 | 0010001001000100100 | 3 | 0100010101000010010 | 5 | 1000001000100000100 | 3 | 1001010100100010100 | 3 |
| 1584 | 0000100000001010000 | 4 | 0010001001000100100 | 4 | 0100010101000010100 | 1 | 1000001000100000100 | 4 | 1001010100100010100 | 4 |
| 1585 | 0000100000001010000 | 5 | 0010001001000100100 | 5 | 0100010101000010100 | 2 | 1000001000100000100 | 5 | 1001010100100010100 | 5 |
| 1586 | 0000100000001010001 | 1 | 0010001001000100101 | 1 | 0100010101000010100 | 3 | 1000001000100000101 | 1 | 1001010100100010101 | 1 |
| 1587 | 0000100000001010001 | 2 | 0010001001000100101 | 2 | 0100010101000010100 | 4 | 1000001000100000101 | 2 | 1001010100100010101 | 2 |
| 1588 | 0000100000001010001 | 3 | 0010001001000100101 | 3 | 0100010101000010100 | 5 | 1000001000100000101 | 3 | 1001010100100010101 | 3 |
| 1589 | 0000100000001010010 | 1 | 0010001001000101000 | 1 | 0100010101000010101 | 1 | 1000001000100001000 | 1 | 1001010100100100000 | 1 |
| 1590 | 0000100000001010010 | 2 | 0010001001000101000 | 2 | 0100010101000010101 | 2 | 1000001000100001000 | 2 | 1001010100100100000 | 2 |
| 1591 | 0000100000001010010 | 3 | 0010001001000101000 | 3 | 0100010101000010101 | 3 | 1000001000100001000 | 3 | 1001010100100100000 | 3 |
| 1592 | 0000100000001010010 | 4 | 0010001001000101000 | 4 | 0100010101000100000 | 1 | 1000001000100001000 | 4 | 1001010100100100000 | 4 |
| 1593 | 0000100000001010010 | 5 | 0010001001000101000 | 5 | 0100010101000100000 | 2 | 1000001000100001000 | 5 | 1001010100100100000 | 5 |
| 1594 | 0000100000001010100 | 1 | 0010001001000101001 | 1 | 0100010101000100000 | 3 | 1000001000100001001 | 1 | 1001010100100100001 | 1 |
| 1595 | 0000100000001010100 | 2 | 0010001001000101001 | 2 | 0100010101000100000 | 4 | 1000001000100001001 | 2 | 1001010100100100001 | 2 |
| 1596 | 0000100000001010100 | 3 | 0010001001000101001 | 3 | 0100010101000100000 | 5 | 1000001000100001001 | 3 | 1001010100100100001 | 3 |
| 1597 | 0000100000001010100 | 4 | 0010001001000101010 | 1 | 0100010101000100001 | 1 | 1000001000100001010 | 1 | 1001010100100100010 | 1 |
| 1598 | 0000100000001010100 | 5 | 0010001001000101010 | 2 | 0100010101000100001 | 2 | 1000001000100001010 | 2 | 1001010100100100010 | 2 |
| 1599 | 0000100000001010101 | 1 | 0010001001000101010 | 3 | 0100010101000100001 | 3 | 1000001000100001010 | 3 | 1001010100100100010 | 3 |
| 1600 | 0000100000001010101 | 2 | 0010001001000101010 | 4 | 0100010101000100010 | 1 | 1000001000100001010 | 4 | 1001010100100100010 | 4 |
| 1601 | 0000100000001010101 | 3 | 0010001001000101010 | 5 | 0100010101000100010 | 2 | 1000001000100001010 | 5 | 1001010100100100010 | 5 |
| 1602 | 0000100000010000001 | 1 | 0010001001001000001 | 1 | 0100010101000100010 | 3 | 1000001000100010000 | 1 | 1001010100100100100 | 1 |
| 1603 | 0000100000010000001 | 2 | 0010001001001000001 | 2 | 0100010101000100010 | 4 | 1000001000100010000 | 2 | 1001010100100100100 | 2 |
| 1604 | 0000100000010000001 | 3 | 0010001001001000001 | 3 | 0100010101000100010 | 5 | 1000001000100010000 | 3 | 1001010100100100100 | 3 |
| 1605 | 0000100000010000010 | 1 | 0010001001001000010 | 1 | 0100010101000100100 | 1 | 1000001000100010000 | 4 | 1001010100100100100 | 4 |
| 1606 | 0000100000010000010 | 2 | 0010001001001000010 | 2 | 0100010101000100100 | 2 | 1000001000100010000 | 5 | 1001010100100100100 | 5 |
| 1607 | 0000100000010000010 | 3 | 0010001001001000010 | 3 | 0100010101000100100 | 3 | 1000001000100010001 | 1 | 1001010100100100101 | 1 |
| 1608 | 0000100000010000010 | 4 | 0010001001001000010 | 4 | 0100010101000100100 | 4 | 1000001000100010001 | 2 | 1001010100100100101 | 2 |
| 1609 | 0000100000010000010 | 5 | 0010001001001000010 | 5 | 0100010101000100100 | 5 | 1000001000100010001 | 3 | 1001010100100100101 | 3 |
| 1610 | 0000100000010000100 | 1 | 0010001001001000100 | 1 | 0100010101000100101 | 1 | 1000001000100010010 | 1 | 1001010100100101000 | 1 |
| 1611 | 0000100000010000100 | 2 | 0010001001001000100 | 2 | 0100010101000100101 | 2 | 1000001000100010010 | 2 | 1001010100100101000 | 2 |
| 1612 | 0000100000010000100 | 3 | 0010001001001000100 | 3 | 0100010101000100101 | 3 | 1000001000100010010 | 3 | 1001010100100101000 | 3 |

FIG. 17C

| Data bits | state | Channel bits | state | Channel bits | state | Channel bits | state | Channel bits | state |
|---|---|---|---|---|---|---|---|---|---|
| 8144 0000010001000000000 | 4 | 0001000000010000000 | 3 | 0001010100101000000 | 4 | 1000000001000000000 | 4 | 1000001000100000000 | 3 |
| 8145 0000010001000000000 | 5 | 0001000000010000000 | 4 | 0001010100101000000 | 5 | 1000000001000000000 | 5 | 1000001000100000000 | 4 |
| 8146 0000010001001000000 | 2 | 0001000000010000000 | 5 | 0001010101000000000 | 3 | 1000000001001000000 | 2 | 1000001000100000000 | 5 |
| 8147 0000010001001000000 | 3 | 0001000000100000000 | 2 | 0001010101000000000 | 4 | 1000000001001000000 | 3 | 1000001000101000000 | 2 |
| 8148 0000010001001000000 | 4 | 0001000000100000000 | 3 | 0001010101000000000 | 5 | 1000000001001000000 | 4 | 1000001000101000000 | 3 |
| 8149 0000010001001000000 | 5 | 0001000000100000000 | 4 | 0001010101001000000 | 2 | 1000000001001000000 | 5 | 1000001000101000000 | 4 |
| 8150 0000010001010000000 | 2 | 0001000000100000000 | 5 | 0001010101001000000 | 3 | 1000000001010000000 | 2 | 1000001000101000000 | 5 |
| 8151 0000010001010000000 | 3 | 0001000000101000000 | 2 | 0001010101001000000 | 4 | 1000000001010000000 | 3 | 1000001001000000000 | 3 |
| 8152 0000010001010000000 | 4 | 0001000000101000000 | 3 | 0001010101001000000 | 5 | 1000000001010000000 | 4 | 1000001001000000000 | 4 |
| 8153 0000010001010000000 | 5 | 0001000000101000000 | 4 | 0001010101010000000 | 2 | 1000000001010000000 | 5 | 1000001001000000000 | 5 |
| 8154 0000010010000000000 | 4 | 0001000000101000000 | 5 | 0001010101010000000 | 3 | 1000000001000000000 | 4 | 1000001001001000000 | 2 |
| 8155 0000010010000000000 | 5 | 0001000001000000000 | 3 | 0001010101010000000 | 4 | 1000000001000000000 | 5 | 1000001001001000000 | 3 |
| 8156 0000010010001000000 | 2 | 0001000001000000000 | 4 | 0001010101010000000 | 5 | 1000000001001000000 | 2 | 1000001001001000000 | 4 |
| 8157 0000010010001000000 | 3 | 0001000001000000000 | 5 | 0010000000001000000 | 2 | 1000000001001000000 | 3 | 1000001001001000000 | 5 |
| 8158 0000010010001000000 | 4 | 0001000001001000000 | 2 | 0010000000001000000 | 3 | 1000000001001000000 | 4 | 1000001001010000000 | 2 |
| 8159 0000010010001000000 | 5 | 0001000001001000000 | 3 | 0010000000001000000 | 4 | 1000000001001000000 | 5 | 1000001001010000000 | 3 |
| 8160 0000010010010000000 | 2 | 0001000001001000000 | 4 | 0010000000001000000 | 5 | 1000000001010000000 | 2 | 1000001001010000000 | 4 |
| 8161 0000010010010000000 | 3 | 0001000001001000000 | 5 | 0010000000010000000 | 2 | 1000000001010000000 | 3 | 1000001001010000000 | 5 |
| 8162 0000010010010000000 | 4 | 0001000001010000000 | 2 | 0010000000010000000 | 3 | 1000000001010000000 | 4 | 1000001010000000000 | 4 |
| 8163 0000010010010000000 | 5 | 0001000001010000000 | 3 | 0010000000010000000 | 4 | 1000000001010000000 | 5 | 1000001010000000000 | 5 |
| 8164 0000010010100000000 | 2 | 0001000001010000000 | 4 | 0010000000010000000 | 5 | 1000000010100000000 | 2 | 1000001010001000000 | 2 |
| 8165 0000010010100000000 | 3 | 0001000001010000000 | 5 | 0010000000100000000 | 2 | 1000000010100000000 | 3 | 1000001010001000000 | 3 |
| 8166 0000010010100000000 | 4 | 0001000010000000000 | 4 | 0010000000100000000 | 3 | 1000000010100000000 | 4 | 1000001010001000000 | 4 |
| 8167 0000010010100000000 | 5 | 0001000010000000000 | 5 | 0010000000100000000 | 4 | 1000000010100000000 | 5 | 1000001010001000000 | 5 |
| 8168 0000010010101000000 | 2 | 0001000010001000000 | 2 | 0010000000100000000 | 5 | 1000000010101000000 | 2 | 1000001010010000000 | 2 |
| 8169 0000010010101000000 | 3 | 0001000010001000000 | 3 | 0010000000101000000 | 2 | 1000000010101000000 | 3 | 1000001010010000000 | 3 |
| 8170 0000010010101000000 | 4 | 0001000010001000000 | 4 | 0010000000101000000 | 3 | 1000000010101000000 | 4 | 1000001010010000000 | 4 |
| 8171 0000010010101000000 | 5 | 0001000010001000000 | 5 | 0010000000101000000 | 4 | 1000000010101000000 | 5 | 1000001010010000000 | 5 |
| 8172 0000010100001000000 | 2 | 0001000010010000000 | 2 | 0010000000101000000 | 5 | 1000000100001000000 | 2 | 1000001010100000000 | 2 |
| 8173 0000010100001000000 | 3 | 0001000010010000000 | 3 | 0010000001000000000 | 3 | 1000000100001000000 | 3 | 1000001010100000000 | 3 |
| 8174 0000010100001000000 | 4 | 0001000010010000000 | 4 | 0010000001000000000 | 4 | 1000000100001000000 | 4 | 1000001010100000000 | 4 |
| 8175 0000010100001000000 | 5 | 0001000010010000000 | 5 | 0010000001000000000 | 5 | 1000000100001000000 | 5 | 1000001010100000000 | 5 |
| 8176 0000010100010000000 | 2 | 0001000010100000000 | 2 | 0010000001001000000 | 2 | 1000000100010000000 | 2 | 1000001010101000000 | 2 |
| 8177 0000010100010000000 | 3 | 0001000010100000000 | 3 | 0010000001001000000 | 3 | 1000000100010000000 | 3 | 1000001010101000000 | 3 |
| 8178 0000010100010000000 | 4 | 0001000010100000000 | 4 | 0010000001001000000 | 4 | 1000000100010000000 | 4 | 1000001010101000000 | 4 |
| 8179 0000010100010000000 | 5 | 0001000010100000000 | 5 | 0010000001001000000 | 5 | 1000000100010000000 | 5 | 1000001010101000000 | 5 |
| 8180 0000010100100000000 | 2 | 0001000010101000000 | 2 | 0010000001010000000 | 2 | 1000000100100000000 | 2 | 1000010000001000000 | 2 |
| 8181 0000010100100000000 | 3 | 0001000010101000000 | 3 | 0010000001010000000 | 3 | 1000000100100000000 | 3 | 1000010000001000000 | 3 |
| 8182 0000010100100000000 | 4 | 0001000010101000000 | 4 | 0010000001010000000 | 4 | 1000000100100000000 | 4 | 1000010000001000000 | 4 |
| 8183 0000010100100000000 | 5 | 0001000010101000000 | 5 | 0010000001010000000 | 5 | 1000000100100000000 | 5 | 1000010000001000000 | 5 |
| 8184 0000010100101000000 | 2 | 0001000100001000000 | 2 | 0010000010000000000 | 4 | 1000000100101000000 | 2 | 1000010000010000000 | 2 |
| 8185 0000010100101000000 | 3 | 0001000100001000000 | 3 | 0010000010000000000 | 5 | 1000000100101000000 | 3 | 1000010000010000000 | 3 |
| 8186 0000010100101000000 | 4 | 0001000100001000000 | 4 | 0010000010001000000 | 2 | 1000000100101000000 | 4 | 1000010000010000000 | 4 |
| 8187 0000010100101000000 | 5 | 0001000100001000000 | 5 | 0010000010001000000 | 3 | 1000000100101000000 | 5 | 1000010000010000000 | 5 |
| 8188 0000010101000000000 | 3 | 0001000100010000000 | 2 | 0010000010001000000 | 4 | 1000000101000000000 | 3 | 1000010000100000000 | 2 |
| 8189 0000010101000000000 | 4 | 0001000100010000000 | 3 | 0010000010001000000 | 5 | 1000000101000000000 | 4 | 1000010000100000000 | 3 |
| 8190 0000010101000000000 | 5 | 0001000100010000000 | 4 | 0010000010010000000 | 2 | 1000000101000000000 | 5 | 1000010000100000000 | 4 |
| 8191 0000010101001000000 | 2 | 0001000100010000000 | 5 | 0010000010010000000 | 3 | 1000000101001000000 | 2 | 1000010000100000000 | 5 |

METHOD AND APPARATUS FOR CODING INFORMATION, METHOD AND APPARATUS FOR DECODING CODED INFORMATION, METHOD OF FABRICATING A RECORDING MEDIUM, THE RECORDING MEDIUM AND MODULATED SIGNAL

CROSS-REFERENCE TO RELATED APPLICATION

The present application is a continuation of application Ser. No. 10/902,920 filed on Aug. 2, 2004, now U.S. Pat. No. 7,030,784, which is a continuation of application Ser. No. 09/707,947 filed on Nov. 8, 2000, now U.S. Pat. No. 6,967,597. The present application also claims priority to EPO Patent Application No. 99203739.0, filed Nov. 11, 1999, and application Ser. No. 09/707,947 the entire contents of both which are hereby incorporated by reference.

FIELD OF THE INVENTION

The present invention relates to coding information, and more particularly, to a method and apparatus for coding information having improved information density. The present invention further relates to producing a modulated signal from the coded information, producing a recording medium from the coded information, and the recording medium itself. The present invention still further relates to a method and apparatus for decoding coded information, and decoding coded information from a modulated signal and/or a recording medium.

BACKGROUND OF THE INVENTION

When data is transmitted through a transmission line or recorded onto a recording medium such as a magnetic disc, an optical disc or a magneto-optical disc, the data is modulated into code matching the transmission line or the recording medium prior to the transmission or recording.

Run length limited codes, generically designated as (d, k) codes, have been widely and successfully applied in modern magnetic and optical recording systems. Such codes, and means for implementing such codes are described by K. A. Schouhamer Immink in the book entitled "Codes for Mass Data Storage Systems" (ISBN 90-74249-23-X, 1999). Run length limited codes are extensions of earlier non return to zero recording codes, where binary recorded "zeros" are represented by no (magnetic flux) change in the recording medium, while binary "ones" are represented by transitions from one direction of recorded flux to the opposite direction.

In a (d, k) code, the above recording rules are maintained with the additional constraints that at least d "zeros" are recorded between successive "ones", and no more than k "zeros" are recorded between successive "ones". The first constraint arises to obviate intersymbol interference occurring because of pulse crowding of the reproduced transitions when a series of "ones" are contiguously recorded. The second constraint arises to ensure recovering a clock from the reproduced data by "locking" a phase locked loop to the reproduced transitions. If there is too long an unbroken string of contiguous "zeros" with no interspersed "ones", the clock regenerating phase-locked-loop will fall out of synchronism. In, for example, a (1,7) code there is at least one "zero" between recorded "ones", and there are no more than seven recorded contiguous "zeros" between recorded "ones".

The series of encoded bits is converted, via a modulo-2 integration operation, to a corresponding modulated signal formed by bit cells having a high or low signal value. A "one" bit is represented in the modulated signal by a change from a high to a low signal value or vice versa, and a "zero" bit is represented by the lack of change in the modulated signal.

The information conveying efficiency of such codes is typically expressed as a rate, which is the quotient of the number of bits (m) in the information word to the number of bits (n) in the code word (i.e., m/n). The theoretical maximum rate of a code, given values of d and k, is called the Shannon capacity. FIG. 1 tabulates the Shannon capacity $C(d,k)$ for d=1 versus k. As shown, for a (1,7) code, the Shannon capacity, $C(1,7)$, has a value of 0.67929. This means that a (1,7) code cannot have a rate larger than 0.67929. The practical implementation of codes requires that the rate be a rational fraction, and to date the above (1,7) code has a rate $2/3$. This rate of $2/3$ is slightly less than the Shannon capacity of 0.67929, and the code is therefore a highly efficient one. To achieve the $2/3$ rate, 2 unconstrained data bits are mapped into 3 constrained encoded bits.

(1,7) codes having a rate of $2/3$ and means for implementing associated encoders and decoders are known in the art. U.S. Pat. No. 4,413,251 entitled "Method and Apparatus for Generating A Noiseless Sliding Block Code for a (1,7) Channel with Rate $2/3$", issued in the names of Adler et al., discloses an encoder which is a finite-state machine having 5 internal states. U.S. Pat. No. 4,488,142 entitled "Apparatus for Encoding Unconstrained Data onto a (1,7) Format with Rate $2/3$", issued in the name of Franaszek discloses an encoder having 8 internal states.

However, a demand exists for even more efficient codes so that, for example, the information density on a recording medium or over a transmission line can be increased.

SUMMARY OF THE INVENTION

In the converting method and apparatus according to the present invention, m-bit information words are converted into n-bit code words at a rate greater than $2/3$. Consequently, the same amount of information can be recorded in less space, and information density increased.

In the present invention, n-bit code words are divided into a first type and a second type, and into coding states of a first kind and a second kind such that an m-bit information word is converted into an n-bit code word of the first or second kind if the previous m-bit information word was converted into an n-bit code word of the first type and is converted into an n-bit code word of the first kind if the previous m-bit information word was converted into an n-bit code word of the second type. In one embodiment, n-bit code words of the first type end in zero, n-bit code words of the second type end in one, n-bit code words of the first kind start with zero, and n-bit code words of the second kind start with zero or one. Furthermore, in the embodiments according to the present invention, the n-bit code words satisfy a dk-constraint of (1,k) such that a minimum of 1 zero and a maximum of k zeros falls between consecutive ones.

In other embodiments of the present invention, the coding device and method according to the present invention are employed to record information on a recording medium and create a recording medium according to the present invention.

In still other embodiments of the present invention, the coding device and method according to the present invention are further employed to transmit information.

In the decoding method and apparatus according to the present invention, n-bit code words created according to the coding method and apparatus are decoded into m-bit information words. The decoding involves determining the state of a next n-bit code word, and based on the state determination, the current n-bit code word is converted into an m-bit information word.

In other embodiments of the present invention, the decoding device and method according to the present invention are employed to reproduce information from a recording medium.

In still other embodiments of the present invention, the decoding device and method according to the present invention are employed to receive information transmitted over a medium.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein:

FIGS. 4A-4H show a complete translation table according to the first embodiment for converting 9-bit information words into 13-bit code words;

FIG. 12 shows an example of how the code words in the various subgroups are allocated in to the various states in the second embodiment;

FIGS. 13A-13C show the beginning, middle and end portions of a translation table according to the second embodiment for converting 9-bit information words into 13-bit code words;

FIG. 14 shows an example of how the code words in the various subgroups are allocated in to the various states in the third embodiment;

FIGS. 15A-15C show the beginning, middle and end portions of a translation table according to the third embodiment for converting 11-bit information words into 16-bit code words FIG. 16 shows an example of how the code words in the various subgroups are allocated in to the various states in the fourth embodiment; and FIGS. 17A-17C show the beginning, middle and end portions of a translation table according to the fourth embodiment for converting 13-bit information words into 19-bit code words.

DETAILED DESCRIPTION OF THE PREFERRED EMBODIMENTS

Figures 1, 2, 3:
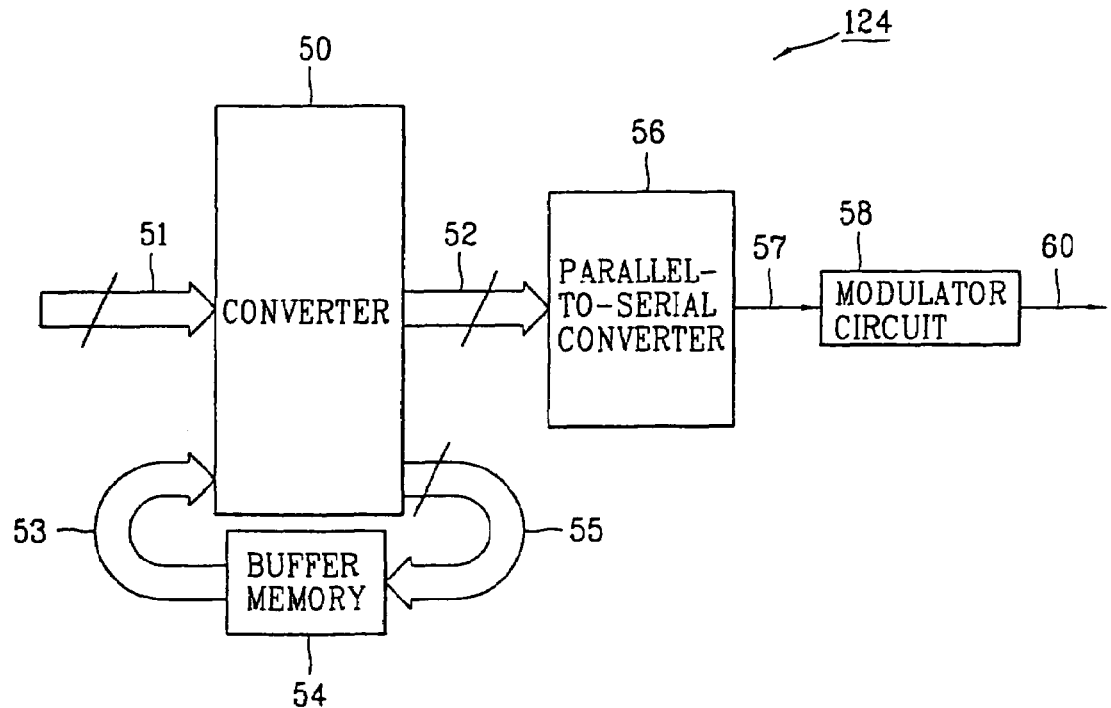
FIG. 1 tabulates the Shannon capacity C(d,k) for d=1 versus k.
FIG. 2 shows an example of how the code words in the various subgroups are allocated in to the various states in the first embodiment.
FIG. 3 shows an embodiment for a coding device according to the invention.

The general coding method according to the present invention will be described followed by a specific first embodiment of the coding method. Next, the general decoding method according to the present invention will be described in the context of the first embodiment. The various apparatuses according to the present invention will then be described. Specifically, the coding device, recording device, transmission device, decoding device, reproducing device and receiving device according to the present invention will be described. Afterwards, additional coding embodiments according to the present invention will be described.

Coding Method

According to the present invention, an m-bit information word is converted into an n-bit code word such that the rate of m/n is greater than 2/3. The code words are divided into first and second types wherein the first type includes code words ending with "0" and the second type includes code words ending with "1." As a result, the code words of the first type are divided into two subgroups E00 and E10, and code words of the second type are divided into two subgroups E01 and E11. Code word subgroup E00 includes code words that start with "0" and end with "0", code word subgroup E01 includes code words that start with "0" and end with "1", code word subgroup E10 includes code words that start with "1" and end with "0", and code word subgroup E11 includes code words that start with "1" and end with "1".

The code words are also divided into at least one state of a first kind and at least one state of a second kind. States of the first kind include code words that only start with "0," and states of the second kind include code words that start with either "0" or "1."

Coding Method According to a First Embodiment

In a first preferred embodiment of the present invention, 9-bit information words are converted into 13-bit code words. The code words satisfy a (d,k) constraint of (1,k), and are divided into 3 states of the first kind and 2 states of the second kind (a total of 5 states). In order to reduce the k-constraint, three code words, namely, "0000000000000", "0000000000001", and "0000000000010" are barred from the encoding tables. An enumeration of code words shows there are 231 code words in subgroup E00, 144 code words in subgroup E10, 143 code words in subgroup E01, and 89 code words in subgroup E11.

To perform encoding, each 13-bit code word in each state is associated with a coding state direction. The state direction indicates the next state from which to select a code word in the encoding process. The state directions are assigned to code words such that code words that end with a "0" (i.e. code words in subgroups E10 and E00) have associated state directions that indicate any of the r=5 states, while code words that end with a "1" (i.e., code words in subgroups E01 and E11) have associated state directions that only indicate one of the states of the first kind. This ensures that the d=1 constraint will be satisfied; namely, after a code word ending in "1", the next code word will start with "0".

Furthermore, while, as explained in more detail below, the same code word can be assigned to different information words in the same state, different states cannot include the same code word. In particular code words in subgroups E10 and E00 can be assigned 5 times to different information words within one state, while code words in subgroups E11 and E01 can be assigned 3 times to different information words within one state. As there are 231 code words in subgroup E00 and 144 code words in subgroup E10, there are 1875 (5*(231+144)) "code word—state direction" combinations for code words of the first type. There are 143 code words in subgroup E01 and 89 code words in E11, so that there are 696 (3*(143+89)) "code word—state direction" combinations for code words of the second type. In total 1875+696=2571 "code word—state direction" combinations exist.

For m-bit information words, there are a total of $2^m$ possible information words. So, for 9-bit information words, $2^9$=512 information words exist. Because there are five states in this encoding embodiment, 5 times 512=2561 of the "code word—state direction" combinations are needed. This leaves 2571−2561=10 remaining combinations.

The available code words in the various subgroups are distributed over the states of the first and second kind in compliance with the restrictions discussed above. FIG. 2 shows an example of how the code words in the various subgroups are allocated in this embodiment to the various states. As shown in FIG. 2, in this example, states 1, 2, and 3 are states of the first kind and states 4 and 5 are states of the second kind. Taking the subgroup E00 of size 230 as an example, subgroup E00 has 76 code words in each of states 1, 2, and 3 plus 1 code word in each of states 4 and 5. And, taking state 1 as an example, in state 1 the number of "code word—state direction" combinations is 5×76+3×44=512, which means that 9-bit information words can be assigned. Remember, each code word of the first type can be assigned any one of the five different states as a state directions, and therefore used five time within a state; while each code word of the second type can only be assigned one of the three states of the first kind as a state direction because of the d=1 restriction, and therefore used three times within a state.

It can be verified that from any of the r=5 coding states shown in FIG. 2 there at least 512 information words that can be assigned to code words, which is enough to accommodate 9-bit information words. In the manner described above any random series of 9-bit information words can be uniquely converted to a series of code words.

FIGS. 4A-4H show a complete translation table according to this embodiment for converting 9-bit information words into 13-bit code words. Included in the translation table of FIGS. 4A-4H are the state direction assigned to each code word. Specifically, in FIGS. 4A-4H, the first column shows the decimal notation of the information words in the second column. The third, fifth, seventh, ninth and eleventh columns show the code words (also referred to in the art as channel bits) assigned to the information words in states 1, 2, 3, 4 and 5, respectively. The fourth, sixth, eighth, tenth and twelfth columns show by way of the respective digits 1, 2, 3, 4 and 5 the state direction of the associated code words in the third, fifth, seventh, ninth and eleventh columns, respectively.

Figures 5, 6:
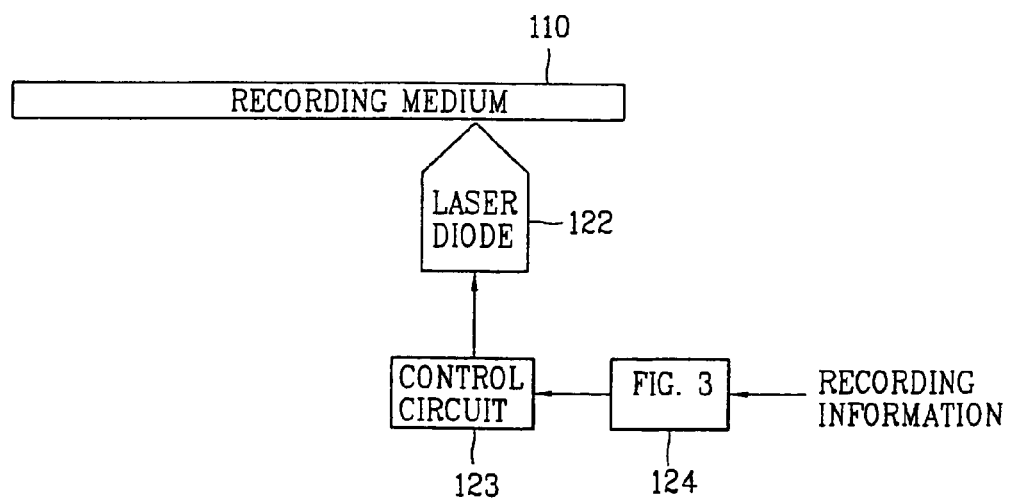
FIG. 5 illustrates the conversion of a series of information words into a series of code words using the translation table of FIGS. 4A-4H.
FIG. 6 illustrates an embodiment of a recording device according to the present invention.

The conversion of a series of information words into a series of code words will be further explained with reference to FIG. 5. The first column of FIG. 5 shows from top to bottom a series of successive 9-bit information words, and the second column shows in parenthesis the decimal values of these information words. The third column "state" is the coding state that is to be used for the conversion of the information word. The "state" is laid down when the preceding code word was delivered (i.e., the state direction of the preceding code word). The fourth column "code words" includes the code words assigned to the information words according to the translation table of FIGS. 4A-H. The fifth column "next state" is the state direction associated with the code word in the fourth column and is also determined according to the translation table of FIGS. 4A-H.

The first word from the series of information words shown in the first column of FIG. 5 has a word value of "1" in decimal notation. Let us assume that the coding state is state 1 (S1) when the conversion of the series of information words is initiated. Therefore the first word is translated into code word "0000000000100" according to the state 1 set of code words from the translation table. At the same time the next state becomes state 2 (S2) because the state direction assigned to code word "0000000000100" representing decimal value 1 in state 1 is state 2. This means that the next information word (decimal value "3") is going to be translated using the code words in state 2. Consequently, the next information word, having a decimal value of "3", is translated into code word "0001010001010". Similar to the manner described above, the information words having the decimal values "5", "12" and "19" are converted.

Decoding Method

Hereinafter, decoding of n-bit code words (in this example 13-bit words) received from a recording medium will be further explained with reference to FIGS. 4A-4H. For the purposes of description, assume that the word values of a series of successive code words received from, for example, a recording medium are "0000000000100", "0001010001010", "0101001001001". From the translation table of FIGS. 4A-4H, it is found that the first code word "0000000000100" is assigned to the information words "0", "1", "2", "3" and "4" and state directions 1, 2, 3, 4 and 5, respectively. The next code word value is "0001010001010", and belongs to the set of code words in state 2. This means that the first code word "0000000000100" had a state direction of 2. The first code word "0000000000100" with a state direction of 2 represents the information word having a decimal value of "1". Therefore, it is determined that the first code word represents information word "000000001" having a decimal value of "1".

Furthermore, the third code word "0101001001001" is a member of state 4. Therefore, it is determined in the same manner as above that the second code word "0001010001010" represents the information word having the decimal value "3". In the same manner other code words can be decoded. It is noted that both the current code word and the next code words are observed to decode the current code word into a unique information word.

Coding Device

FIG. 3 shows an embodiment for a coding device 124 according to the invention. The coding device 124 converts m-bit information words into n-bit code words, where the number of different coding states r is represented by s bits. For example, when the number of coding states r=5, s equals 3. As shown, the coding device 124 includes a converter 50 for converting (m+s) binary input signals to (n+s) binary output signals. In a preferred embodiment, the converter 50 includes a read only memory (ROM) storing a translation table according to at least one embodiment of the present invention and address circuitry for addressing the translation table based on the m+s binary input signals. However, instead of a ROM, the converter 50 can include a combinatorial logic circuit producing the same results as the translation table according to at least one embodiment of the present invention.

From the inputs of the converter 50, m inputs are connected to a first bus 51 for receiving m-bit information words. From the outputs of the converter 50, n outputs are connected to a second bus 52 for delivering n-bit code words. Furthermore, s inputs are connected to an s-bit third bus 53 for receiving a state word that indicates the instantaneous coding state. The state word is delivered by a buffer memory 54 including, for example, s flip-flops. The buffer memory 54 has s inputs connected to a fourth bus 55 for receiving a state direction to be loaded into the buffer memory 54 as the state word. For delivering the state directions to be loaded in the buffer memory 54, the s outputs of the converter 50 are used.

The second bus 52 is connected to the parallel inputs of a parallel-to-serial converter 56, which converts the code words received over the second bus 52 to a serial bit string. A signal line 57 supplies the serial bit string to a modulator circuit 58, which converts the bit string into a modulated signal. The modulated signal is then delivered over a line 60. The modulator circuit 58 is any well-known circuit for converting binary data into a modulated signal such as a modula-2 integrator.

For the purposes of synchronizing the operation of the coding device, the coding device includes a clock generating circuit (not shown) of a customary type for generating clock signals for controlling timing of, for example, the parallel/serial converter 58 and the loading of the buffer memory 54.

In operation, the converter 50 receives m-bit information words and an s-bit state word from the first bus 51 and the third bus 53, respectively. The s-bit state word indicates the state in the translation table to use in converting the m-bit information word. Accordingly, based on the value of the m-bit information word, the n-bit code word is determined from the code words in the state identified by the s-bit state word. Also, the state direction associated with the n-bit code word is determined. The state direction, namely, the value thereof is converted into an s-bit binary word; or alternatively, the state directions are stored in the translation table as s-bit binary words. The converter 50 outputs the n-bit code word on the second bus 52, and outputs the s-bit state direction on fourth bus 55. The buffer memory 54 stores the s-bit state direction as a state word, and supplies the s-bit state word to the converter 50 over the third bus 53 in synchronization with the receipt of the next m-bit information word by the converter 50. This synchronization is produced based on the clock signals discussed above in any well-known manner.

The n-bit code words on the second bus 52 are converted to serial data by the parallel/serial converter 56, and then the serial data is converted into a modulated signal by the modulator 58.

The modulated signal may then undergo further processing for recordation or transmission.

Recording Device

FIG. 6 shows a recording device for recording information that includes the coding device 124 according to the present invention as shown in FIG. 3. As shown in FIG. 6, m-bit information is converted into a modulated signal through the coding device 124. The modulated signal produced by the coding device 124 is delivered to a control circuit 123. The control circuit 123 may be any conventional control circuit for controlling an optical pick-up or laser diode 122 in response to the modulated signal applied to the control circuit 123 so that a pattern of marks corresponding to the modulated signal are recorded on the recording medium 110.

Figure 7:
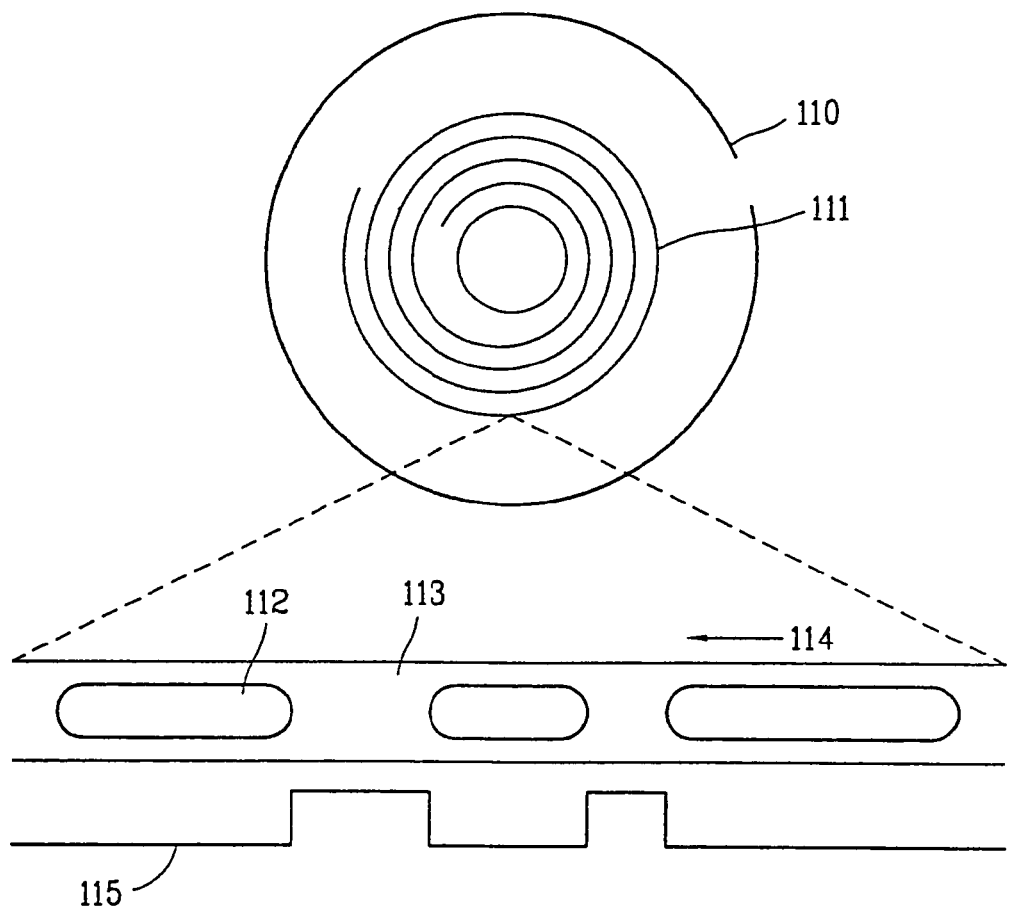
FIG. 7 illustrates a recording medium and modulated signal according to the present invention.

FIG. 7 shows by way of example, a recording medium 110 according to the invention. The recording medium 110 shown is a read-only memory (ROM) type optical disc. However, the recording medium 110 of the present invention is not limited to a ROM type optical disk, but could be any type of optical disk such as a write-once read-many (WORM) optical disk, random accessible memory (RAM) optical disk, etc. Further, the recording medium 110 is not limited to being an optical disk, but could be any type of recording medium such as a magnetic disk, a magneto-optical disk, a memory card, magnetic tape, etc.

As shown in FIG. 7, the recording medium 110 according to one embodiment of the present invention includes information patterns arranged in tracks 111. Specifically, FIG. 7 shows an enlarged view of a track 111 along a direction 114 of the track 111. As shown, the track 111 includes pit regions 112 and non-pit regions 113. Generally, the pit and non-pit regions 112 and 113 represent constant signal regions of the modulated signal 115 (zeros in the code words) and the transitions between pit and non-pit regions represent logic state transitions in the modulated signal 115 (ones in the code words).

As discussed above, the recording medium 110 may be obtained by first generating the modulated signal and then recording the modulated signal on the recording medium 110. Alternatively, if the recording medium is an optical disc, the recording medium 110 can also be obtained with well-known mastering and replica techniques.

Transmission Device

Figure 8:
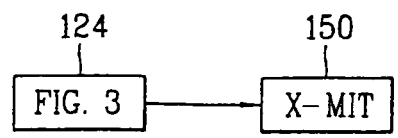
FIG. 8 illustrates a transmission device according to the present invention.

FIG. 8 shows a transmission device for transmitting information that includes the coding device 124 according to the present invention as shown in FIG. 3. As shown in FIG. 8, m-bit information words are converted into a modulated signal through the coding device 124. A transmitter 150 then further processes the modulated signal, to convert the modulated signal into a form for transmission depending on the communication system to which the transmitter belongs, and transmits the converted modulated signal over a transmission medium such as air (or space), optical fiber, cable, a conductor, etc.

Decoding Device

Figure 9:
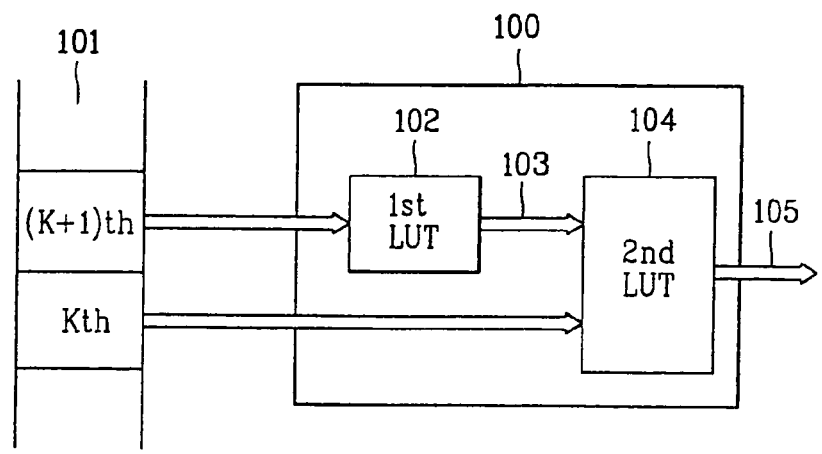
FIG. 9 illustrates a decoding device according to the present invention.

FIG. 9 illustrates a decoder according to the present invention. The decoder performs the reverse process of the converter of FIG. 3 and converts n-bit code words of the present invention into m-bit information words. As shown, the decoder 100 includes a first look-up table (LUT) 102 and a second LUT 104. The first and second LUTs 102 and 104 store the translation table used to create the n-bit code words being decoded. Where K refers to time, the first LUT 102 receives the (K+1)th n-bit code word and the second LUT 104 receives the output of the first LUT 102 and the Kth n-bit code word. Accordingly, the decoder 100 operates as a sliding block decoder. At every block time instant the decoder 100 decodes one n-bit code word into one m-bit information word and proceeds with the next n-bit code word in the serial data (also referred to as the channel bit stream).

In operation, the first LUT 102 determines the state of the (K+1)th code word from the stored translation table, and outputs the state to the second LUT 104. So the output of the first LUT 102 is a binary number in the range of 1, 2, . . . , r (where r denotes the number of states in the translation table). The second LUT 104 determines the possible m-bit information words associated with Kth code word from the Kth code word using the stored translation table, and then determines the specific one of the possible m-bit information words being represented by the n-bit code word using the state information from the first LUT 102 and the stored translation table.

For the purposes of further explanation only, assume the n-bit code words are 13-bit code words produced using the translation table of FIGS. 4A-4H. Then, referring to FIG. 5, if the (K+1)th 13-bit code word is "0001010001010" the first LUT 102 determines the state as state 2. Furthermore, if the Kth 13-bit code word is "0000000000100", then the second LUT 104 determines that the Kth 13-bit code word represents one of the 9-bit information words having a decimal value of 0, 1, 2, 3 or 4. And, because the next state or state direction of state 2 is supplied by the first LUT 102, the second LUT 104 determines that the Kth 13-bit code word represents the 9-bit information word having a decimal value of 1 because the 13-bit code word "0000000000100" associated with a state direction of 2 represents the 9-bit information word having a decimal value of 1.

Reproducing Device

Figure 10:
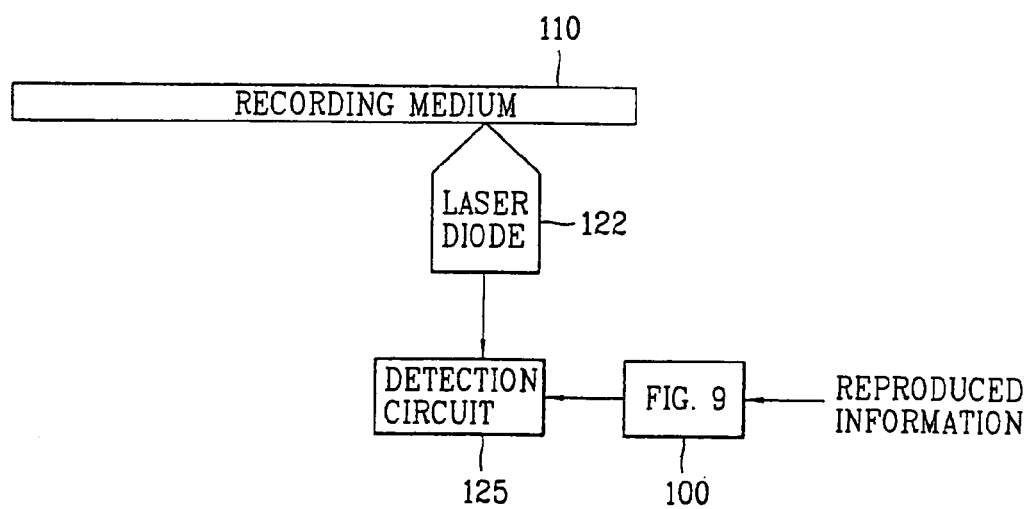
FIG. 10 illustrates a reproducing device according to the present invention.

FIG. 10 illustrates a reproducing device that includes the decoder 100 according to the present invention as shown in FIG. 9. As shown, the reading device includes an optical pick-up 122 of a conventional type for reading a recording medium 110 according to the invention. The recording medium 110 may be any type of recording medium such as discussed previously. The optical pick-up 122 produces an analog read signal modulated according to the information pattern on the recording medium 110. A detection circuit 125 converts this read signal in conventional fashion into a binary signal of the form acceptable to the decoder 100. The decoder 100 decodes the binary signal to obtain the m-bit information words.

Receiving Device

Figure 11:
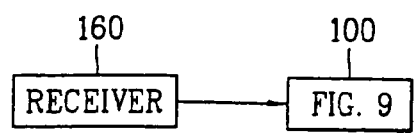
FIG. 11 illustrates a receiving device according to the present invention.

FIG. 11 illustrates a receiving device that includes the decoder 100 according to the present invention as shown in FIG. 9. As shown, the receiving device includes a receiver 160 for receiving a signal transmitted over a medium such as air (or space), optical fiber, cable, a conductor, etc. The receiver 160 converts the received signal into a binary signal of the form acceptable to the decoder 100. The decoder 100 decodes the binary signal to obtain the m-bit information words.

Coding Method According to a Second Embodiment

FIGS. 12 and 13A-13C illustrate another embodiment of the present invention. According to this embodiment, the greater than ⅔ rate is achieved by converting 9-bit information words into 13-bit code words; wherein the number of coding states r equals 13, and 8 of the coding states are coding states of the first kind and 5 of the coding states are coding states of the second kind. Also, the code words satisfy a (d,k) constraint of (1,k). FIG. 12 corresponds to FIG. 2 of the first embodiment, and illustrates the division of code words among the states in this second embodiment.

As described above, code words that end with a "0", i.e. code words in subgroups E00 and E10, are allowed to enter any of the r=13 states, while code words that end with a "1" i.e. code words in subgroups E01 and E11, may only enter the states of the first kind (State 1 to State 8).

Therefore, code words in subgroups E00 and E10 can be assigned 13 times to different information words, while code words in subgroups E01 and E11 can be assigned 8 times to different information words. Referring to FIG. 12, subgroup E00 has 24 code words in state 1 and the subgroup E01 has 25 code words in state 1. So the number of "code words—state direction" combinations is (13×24)+(8×25)=512, which means that 9-bit information words can be assigned. It can be verified that from any of the r=13 coding states there at least 512 information words that can be assigned to code words, which is enough to accommodate 9-bit information words.

Figure 13A:
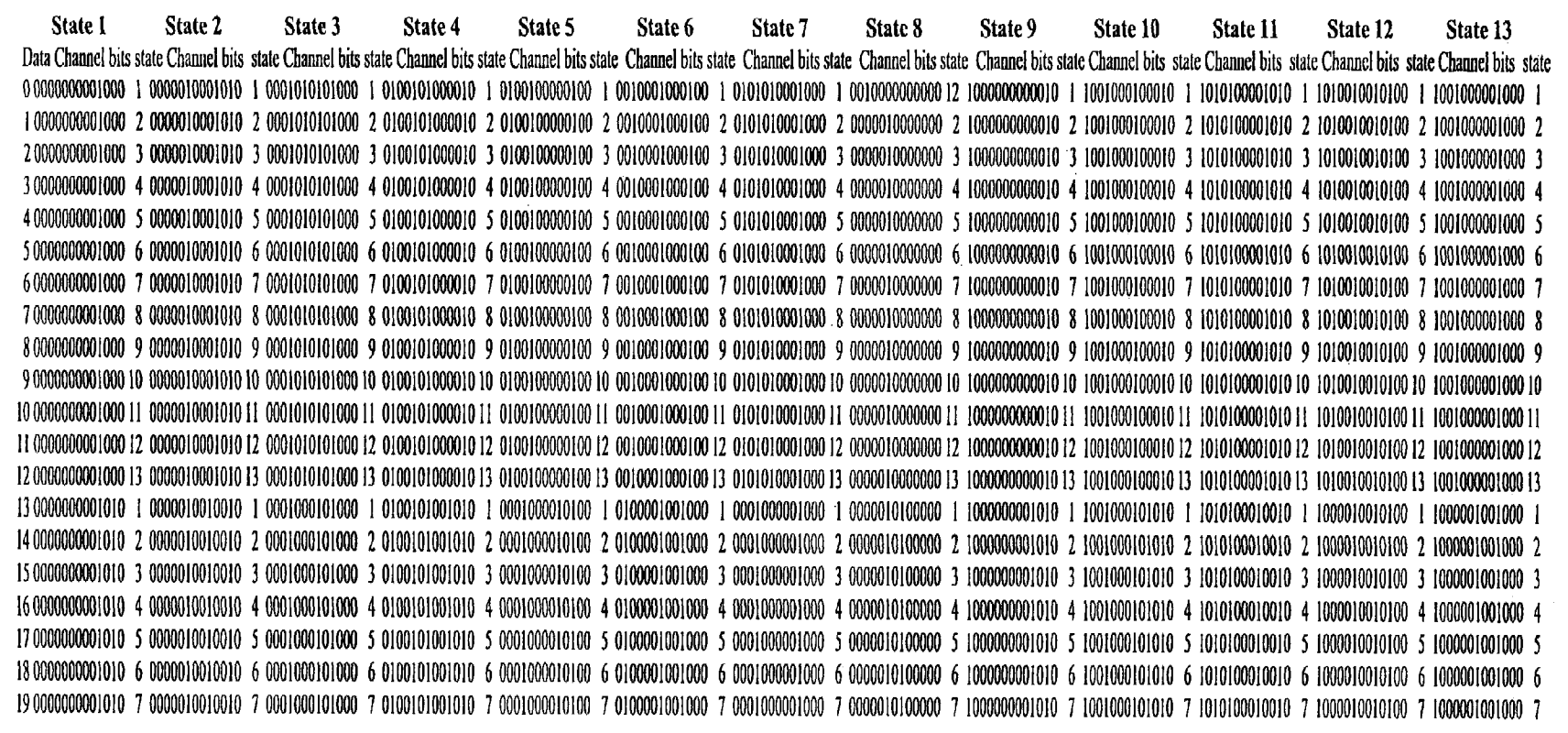
Figure 13C:
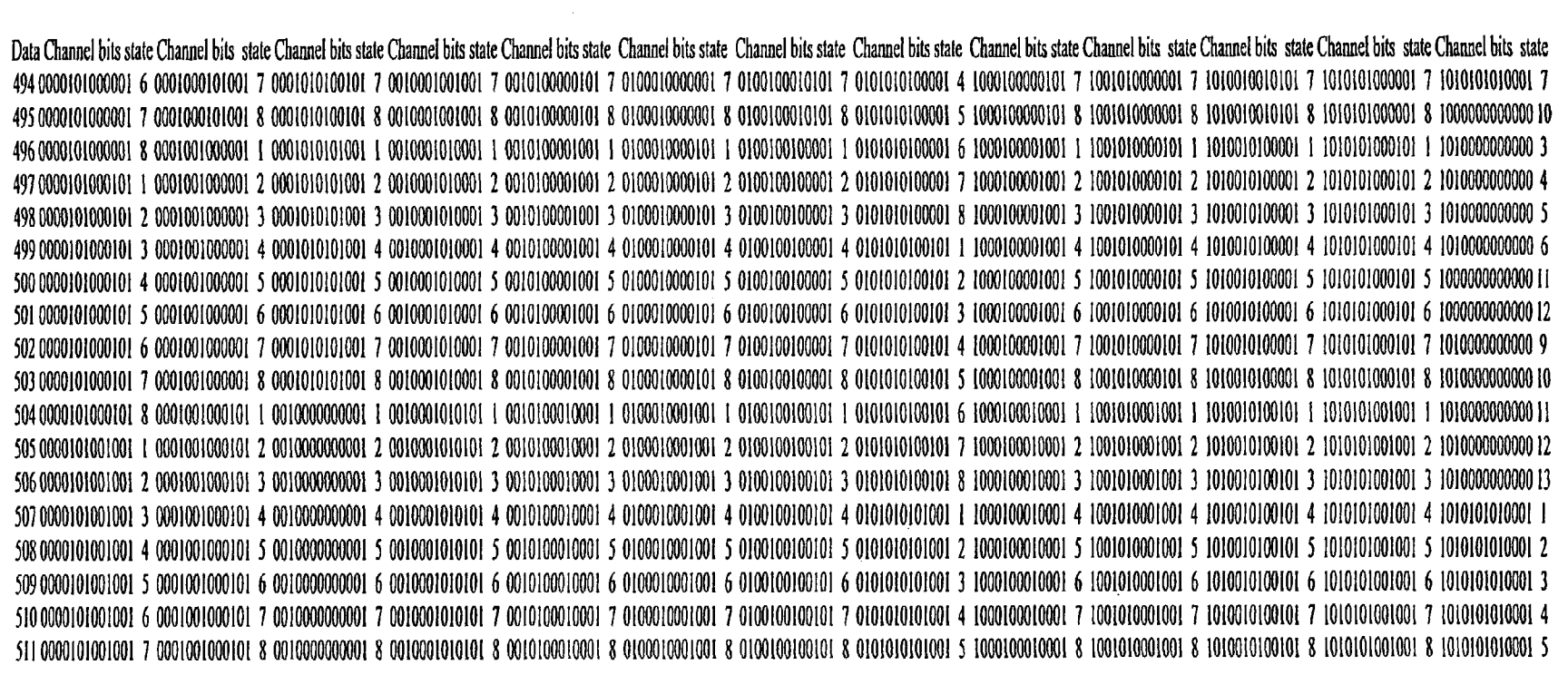

FIGS. 13A-13C illustrate the beginning, middle and end portions of the translation table for this second embodiment in the same fashion that FIGS. 4A-4H illustrated the translation table for the first embodiment.

Coding Method According to a Third Embodiment

FIGS. 14 and 15A-15C illustrate another embodiment of the present invention. According to this embodiment, the greater than ⅔ rate is achieved by converting 11-bit information words into 16-bit code words; wherein the number of coding states r equals 13, and 8 of the coding states are coding states of the first kind and 5 of the coding states are coding states of the second kind. Also, the code words satisfy a (d,k) constraint of (1,k). FIG. 14 corresponds to FIG. 2 of the first embodiment, and illustrates the division of code words among the states in this third embodiment. It can be verified that from any of the r=13 coding states there at least 2048 information words that can be assigned to code words, which is enough to accommodate 11-bit information words.

Figure 15A:
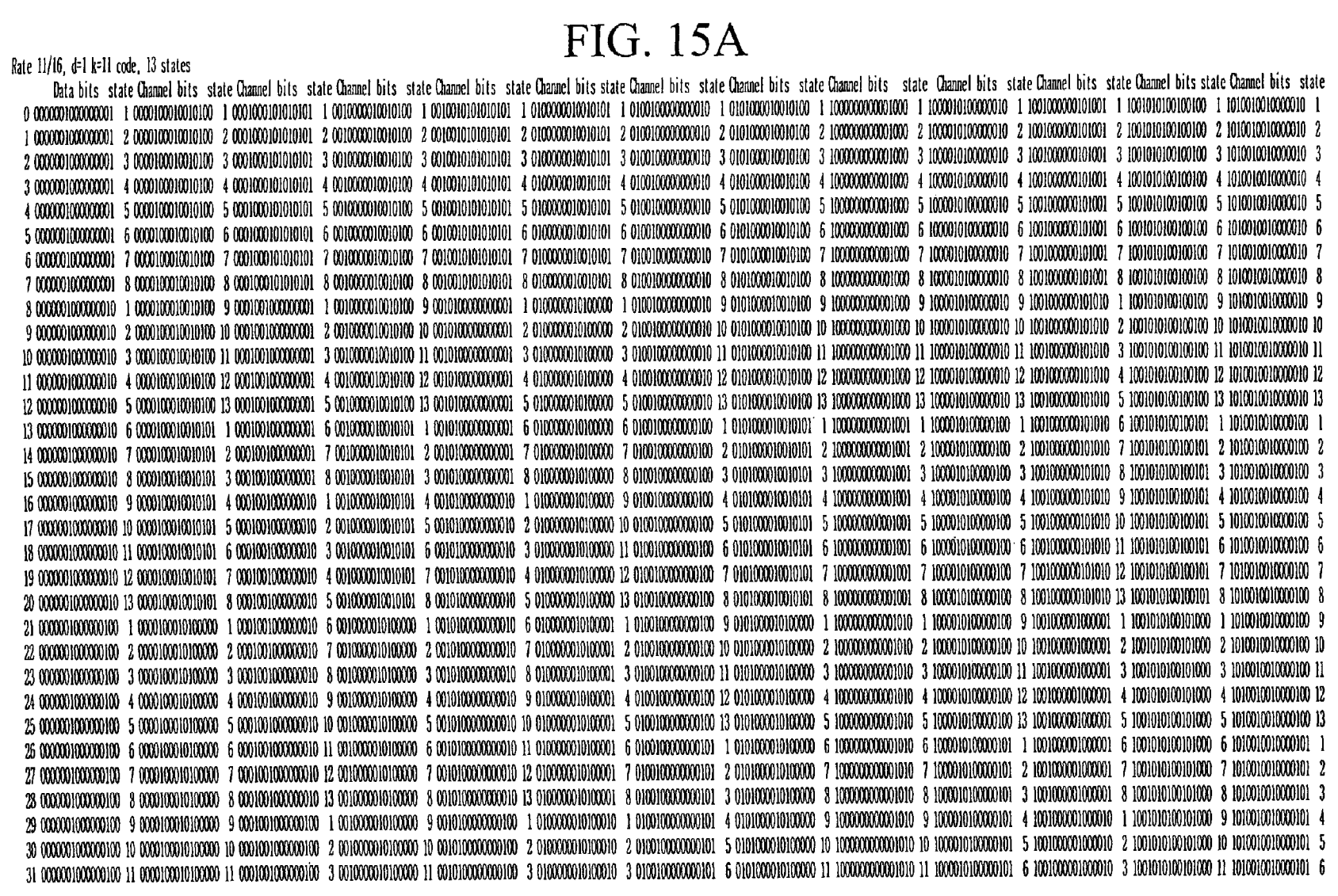
Figure 15B:
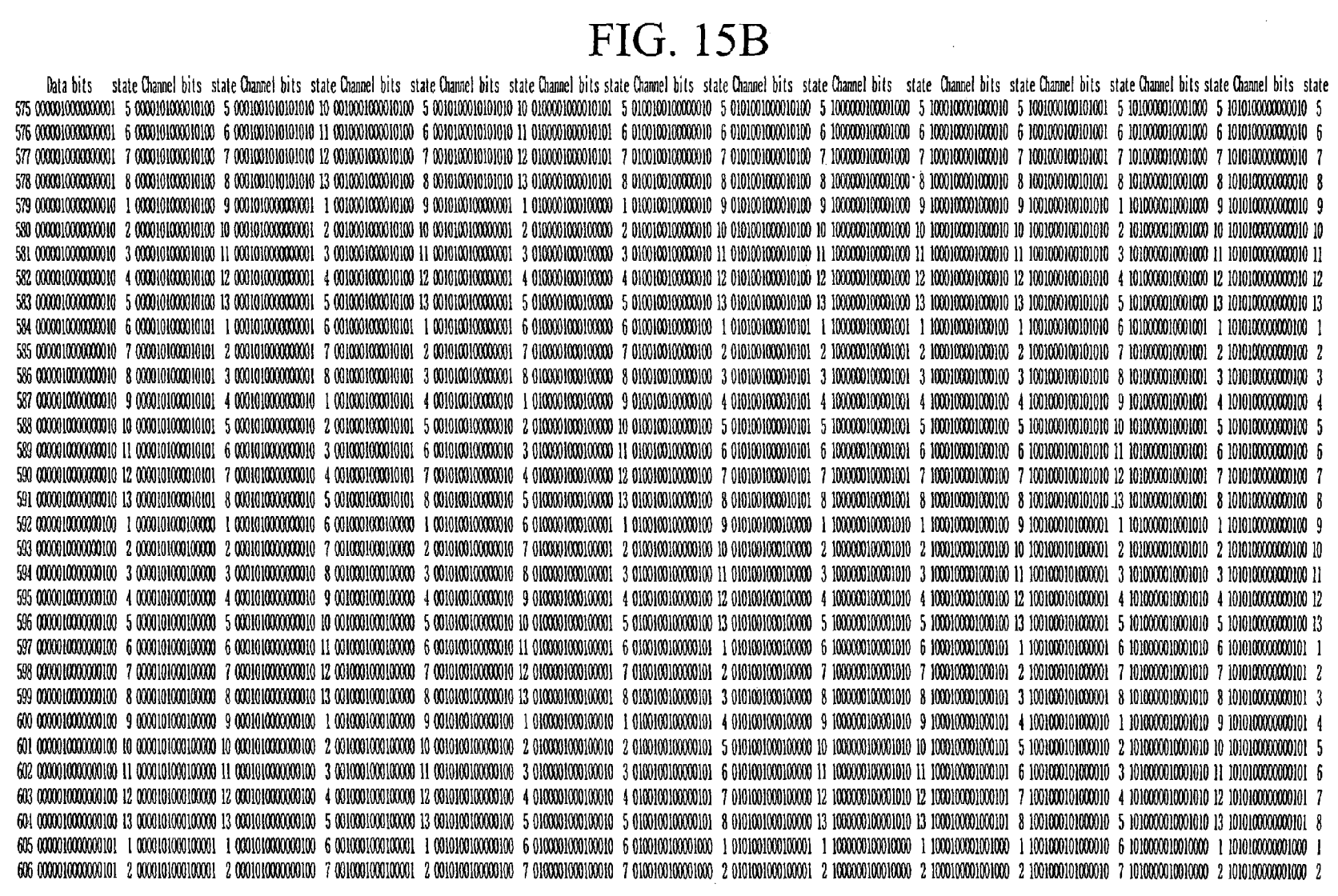
Figure 15C:
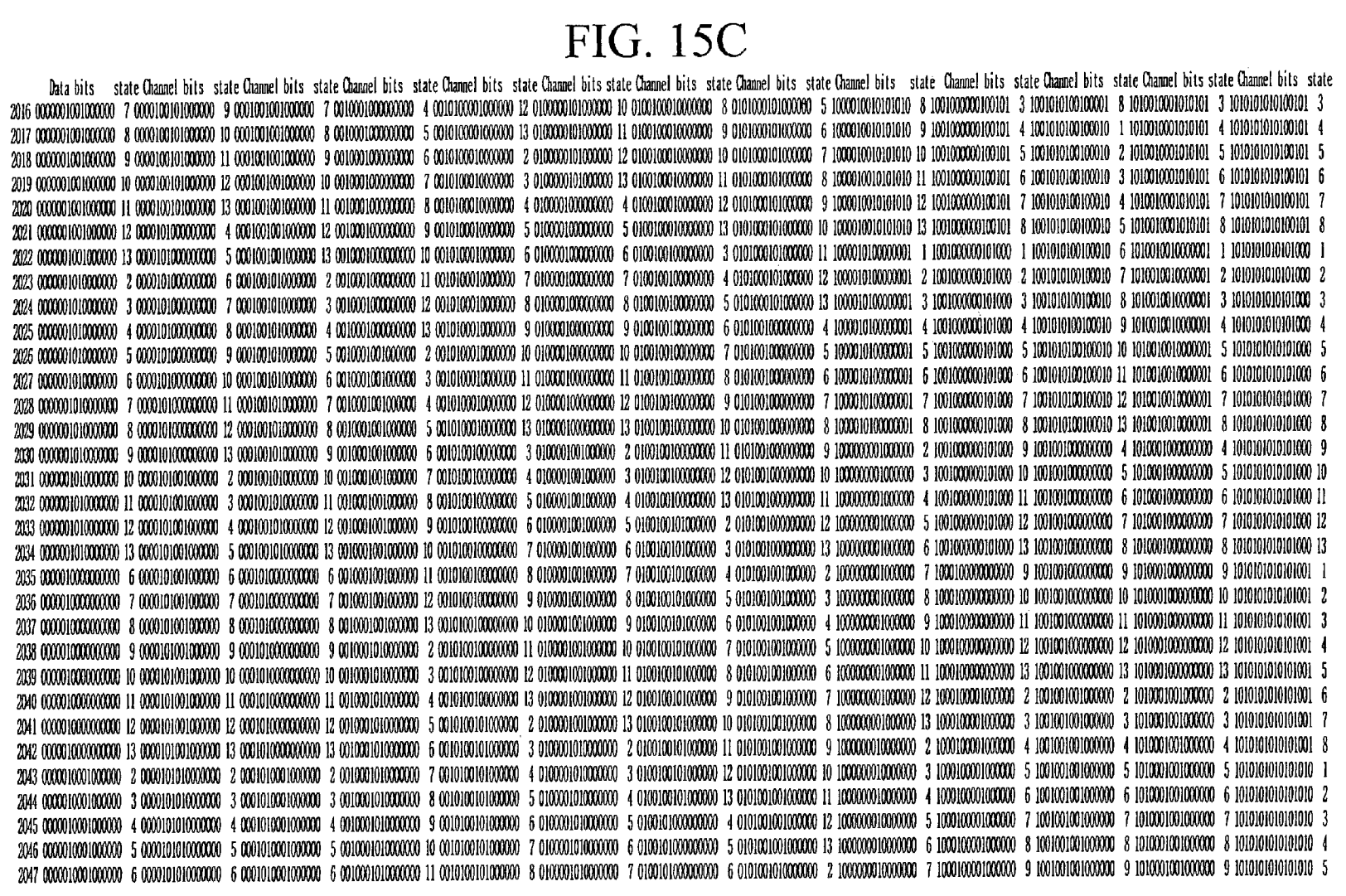

FIGS. 15A-15C illustrate the beginning, middle and end portions of the translation table for the third embodiment in the same fashion that FIGS. 4A-4H illustrated the translation table for the first embodiment.

Coding Method According to a Fourth Embodiment

FIGS. 16 and 17A-17C illustrate another embodiment of the present invention. According to this embodiment, the greater than ⅔ rate is achieved by converting 13-bit information words into 19-bit code words; wherein the number of coding states r equals 5, and 3 of the coding states are coding states of the first kind and 2 of the coding states are coding states of the second kind. Also, the code words satisfy a (d,k) constraint of (1,k). FIG. 16 corresponds to FIG. 2 of the first embodiment, and illustrates the division of code words among the states in this fourth embodiment. It can be verified that from any of the r=5 coding states there at least 8192 information words that can be assigned to code words, which is enough to accommodate 13-bit information words.

FIGS. 17A-17C illustrate the beginning, middle and end portions the translation table for the fourth embodiment in the same fashion that FIGS. 4A-4H illustrated the translation table for the first embodiment.

The invention has been described in detail with particular reference to preferred embodiments thereof, but it will be understood that variations and modifications can be effected within the spirit and scope of the invention.

What is claimed is:

1. A method for converting information words, comprising:
receiving m-bit information words, where m is an integer; and
converting the m-bit information words into n-bit code words based on a code conversion table including a plurality of coding states, where n is an integer greater than m,
wherein the n-bit code words are divided into a first type and a second type and into coding states of a first kind and a second kind, the coding states of the first and second kinds forming a code conversion table, each coding state including at least two code words of a same value representing information words of a different value, such that an m-bit information word is converted into an n-bit code word of the first type and an m-bit information word is converted into an n-bit code word of the first kind if a previous m-bit information word was converted into an n-bit code word of the second type, and wherein the n-bit code words in the coding state of the first kind start with zero, and the n-bit code words in the coding state of the second kind start with zero or one.

2. A method of converting information words, comprising:

receiving m-bit information words, where m is an integer; and converting the m-bit information words into n-bit code words based on a code conversion table including a plurality of coding states, where n is an integer greater than m, wherein the plurality of coding states are categorized into a first kind or a second kind and a number of coding states of the first kind is greater than a number of coding states of the second kind, wherein each coding state includes at least two code words of a same value representing information words of a different value, wherein a minimum number of zeros between consecutive ones in the n-bit code words is 1, and wherein the n-bit code words in a coding state of the first kind start with zero, and the n-bit code words in the coding state of the second kind start with zero or one.

3. The method of claim 1, wherein the n-bit code words are divided into p coding states of the first kind and q coding states of the second kind.

4. The method of claim 1, wherein the converting step converts an m-bit information word into an n-bit code word of the first kind if a last bit of a previous n-bit code word was 1.

5. The method of claim 1, wherein the converting step converts an m-bit information word into an n-bit code word of the second kind if a last bit of a previous n-bit code word was 0.

6. The method of claim 1, further comprising:
generating a modulated signal from the converted n-bit code words.

7. The method of claim 6, further comprising:
recording the modulated signal in a recording medium.

8. The method of claim 6, further comprising:
transmitting the modulated signal.

9. The method of claim 1, wherein the converting step converts the m-bit information words using a translation table.

10. A coding device, comprising:
a converter configured to receive m-bit information words, where m is integer and to convert the m-bit information words into n-bit code words based on a code conversion table including a plurality of coding states, where n is integer greater than m, wherein the plurality of coding states are categorized into a first kind or a second kind and a number of coding states of the first kind is greater than a number of coding states of the second kind, wherein each coding state includes at least two code words of same value representing information words of different value, wherein a minimum number of zeros between consecutive ones in the n-bit code words is 1, and wherein the n-bit code words in the coding state of the first kind start with zero, and the n-bit code words in the coding state of the second kind start with zero or one.

11. The coding device of claim 10, wherein the converter receives a coding state with each m-bit information word and converts the m-bit information word into the n-bit code word based on the received coding state.

12. The coding device of claim 11, further comprising:
a buffer configured to supply the coding state to the converter, wherein the converter determines a coding state for a next m-bit information word as part of converting the m-bit information words into n-bit code words, and stores the determined coding state in the buffer.

13. The coding device of claim 10, further comprising:
a modulator configured to generate a modulated signal from the converted n-bit code words.

14. The coding device of claim 13, further comprising:
a recording device configured to record the modulated signal in a recording medium.

15. The coding device of claim 13, further comprising:
a transmitter configured to transmit the modulated signal.

16. A method of manufacturing a recording medium, comprising:

converting m-bit information words into n-bit code words based on a code conversion table including a plurality of coding states, where n is an integer greater than m, wherein the plurality of coding states are categorized into a first kind or a second kind and a number of coding states of the first kind is greater than a number of coding states of the second kind, and each coding state includes at least two code words of a same value representing information words of a different value;

generating a modulated signal from the converted n-bit code words; and recording the modulated signal in the recording medium, wherein a minimum number of zeros between consecutive ones in the n-bit code words is 1, and wherein the n-bit code words in the coding state of the first kind start with zero, and the n-bit code words in the coding state of the second kind start with zero or one.

17. A recording medium, comprising:
a track having a modulated signal recorded therein, the modulated signal including signal portions representing n-bit code words, where n is an integer, and each n-bit code word representing an m-bit information word, where m is an integer less than n, wherein the n-bit code words are divided into coding states of a first kind and a second kind, the coding states of the first and second kinds forming a code conversion table and a number of coding states of the first kind is greater than a number of coding states of the second kind, wherein each coding state includes at least two code words of a same value representing information words of a different value, wherein a minimum number of zeros between consecutive ones in the n-bit code words is 1, and wherein the n-bit code words in the coding state of the first kind start with zero, and the n-bit code words in the coding state of the second kind start with zero or one.

18. A modulated signal, comprising:
signal portions representing n-bit code words, where n is an integer, each n-bit code word representing an m-bit information word, where m is an integer less than n, wherein the n-bit code words are divided into coding states of a first kind and a second kind, the coding states of the first and second kinds forming a code conversion table and a number of coding states of the first kind is greater than a number of coding states of the second kind, wherein each coding state includes at least two code words of same value representing information words of a different value, wherein a minimum number of zeros between consecutive ones in the n-bit code words is 1, and wherein the n-bit code words in the coding stats of the first kind start with zero, and the n-bit code words in the coding state of the second kind start with zero or one.

19. A method of decoding, comprising:

receiving n-bit code words, where n is an integer; and converting the n-bit code words into m-bit information words based on a code conversion table including a plurality of coding states, where m is an integer less than n, wherein the n-bit code words are divided into coding states of a first kind and a second kind, the coding states of the first and second kinds forming a code conversion table, and a number of coding states of the first kind is greater than a number of coding states of the second kind, wherein each coding state includes at least two code words of a same value representing information words of a different value, wherein a minimum number of zeros between consecutive ones in the n-bit code words is 1, and wherein the n-bit code words in the coding state of the first kind start with zero, and the n-bit code words in the coding state of the second kind start with zero or one.

20. The method of claim 19, wherein the converting step determines to which of p and q coding states a next n-bit code word belongs, and converts a current n-bit code word into an m-bit information word based on the determined coding state.

21. The method of claim 19, further comprising:

reproducing a modulated signal from a recording medium; and demodulating the modulated signal into at least the m-bit information words.

22. A decoding device, comprising:

a converter configured to receive n-bit code words, where n is an integer, and to convert the n-bit code words into m-bit information words based on a code conversion table including a plurality of coding states, where m is an integer less than n, wherein the n-bit code words are divided into coding states of a first kind and a second kind, the coding states of the first and second kinds forming a code conversion table, and a number of coding states of the first kind is greater than a number of coding states of the second kind, wherein each coding state includes at least two code words of a same value representing information words of a different value, wherein a minimum number of zeros between consecutive ones in the n-bit code words is 1, and wherein the n-bit code words in the coding state of the first kind start with zero, and the n-bit code words in the coding state of the second kind start with zero or one.

23. The decoding device of claim 22, wherein the converter determines to which of p and q coding states a next n-bit code word belongs, and converts a current n-bit code word into an m-bit information word based on the determined coding state.

24. The decoding device of claim 22, further comprising:

a demodulator configured to receive a modulated signal and demodulating the modulated signal into at least the m-bit information words.

25. The decoding device of claim 24, further comprising:

a reproducing device configured to reproduce the modulated signal from a recording medium, and to demodulate the modulated signal into at least the m-bit information words.

26. The method of claim 1, further comprising:

receiving a coding state with each m-bit information word, wherein the converting step converts the m-bit information word into the n-bit code word based on the received coding state, said coding state corresponding to a previous coding state used to convert the previous m-bit information word.

27. The method of claim 2, further comprising:

receiving a coding state with each m-bit information word, wherein the converting step converts the m-bit information word into the n-bit code word based on the received coding state, said coding state corresponding to a previous coding state used to convert the previous m-bit information word.

28. The coding device of claim 11, wherein the coding state corresponds to a previous coding state used to convert a previous m-bit information word.

29. The method of claim 16, further comprising:

receiving a coding state with each m-bit information word, wherein the converting step converts the m-bit information word into the n-bit code word based on the received coding state, said coding state corresponding to a previous coding state used to convert a previous m-bit information word.

* * * * *